US010687145B1

(12) United States Patent
Campbell

(10) Patent No.: US 10,687,145 B1
(45) Date of Patent: Jun. 16, 2020

(54) THEATER NOISE CANCELING HEADPHONES

(71) Applicant: Jeffery R. Campbell, Warkworth (CA)

(72) Inventor: Jeffery R. Campbell, Warkworth (CA)

( * ) Notice: Subject to any disclaimer, the term of this patent is extended or adjusted under 35 U.S.C. 154(b) by 0 days.

(21) Appl. No.: 16/507,312

(22) Filed: Jul. 10, 2019

(51) Int. Cl.

| | |
|---|---|
| ***H03B 29/00*** | (2006.01) |
| ***H04R 5/04*** | (2006.01) |
| ***G10K 11/178*** | (2006.01) |
| ***H04R 1/10*** | (2006.01) |
| ***H04H 20/61*** | (2008.01) |
| ***H04H 60/58*** | (2008.01) |
| ***H04H 20/88*** | (2008.01) |

(52) U.S. Cl.
CPC ......... *H04R 5/04* (2013.01); *G10K 11/17853* (2018.01); *H04H 20/61* (2013.01); *H04H 20/88* (2013.01); *H04H 60/58* (2013.01); *H04R 1/1083* (2013.01); *G10K 2210/1081* (2013.01)

(58) Field of Classification Search
CPC ........................................................ H03B 29/00
See application file for complete search history.

(56) References Cited

U.S. PATENT DOCUMENTS

| | | | | |
|---|---|---|---|---|
| 2007/0242834 A1* | 10/2007 | Coutinho | H04H 20/61 | 381/71.8 |
| 2014/0079241 A1* | 3/2014 | Chan | H04W 4/21 | 381/77 |
| 2014/0118616 A1* | 5/2014 | Oughriss | H04N 7/025 | 348/462 |
| 2014/0334644 A1* | 11/2014 | Selig | G06F 3/165 | 381/108 |
| 2015/0319518 A1* | 11/2015 | Wilson | H04R 1/10 | 381/71.6 |
| 2016/0112791 A1* | 4/2016 | Leary | H04R 27/00 | 381/309 |
| 2018/0285133 A1* | 10/2018 | Havell | G06F 9/454 | |
| 2019/0379989 A1* | 12/2019 | Anastas | H04R 5/033 | |

* cited by examiner

*Primary Examiner* — Olisa Anwah
(74) *Attorney, Agent, or Firm* — Christopher P. Maiorana, PC

(57) ABSTRACT

A system includes an audio broadcast device, headphones and an interface device. The audio broadcast device may be configured to generate a plurality of audio tracks. The headphones may be configured to perform noise cancellation of ambient audio, decode one of the plurality of audio tracks selected by a user and playback a personalized audio track in response to the selected audio track and user settings. The interface device may be configured to receive the user settings and enable the user to select one of the audio tracks. The headphones may receive the selected audio track from the audio broadcast device in response to the selection using the interface. The user settings may be applied to the selected audio track to generate the personalized audio track.

20 Claims, 23 Drawing Sheets

THEATER NOISE CANCELING HEADPHONES

FIELD OF THE INVENTION

The invention relates to audio systems generally and, more particularly, to a method and/or apparatus for implementing theater noise canceling headphones.

BACKGROUND

Compared to video, the audio experience during theater viewing of motion picture films has changed little in the last century. Video quality has improved and innovations have become more common (i.e., 3D video, digital video, etc.). Audio output has only seen marginal improvement. Some audio improvements, such as subwoofer systems and speaker enhancements, have even caused some movie goers to complain about unacceptably high volume levels.

Ambient noise is an issue for theater attendees. Modern theaters are built as commercial enterprises where the cost of each movie screening is recovered through admission fees from a large group of attendees. Therefore, movie theaters are designed to hold a substantial number of people. A large number of people in close quarters results in a constant amount of ambient noise. Theaters supplement ticket revenue through the sale of popcorn, snacks and refreshments. The activity of removing popcorn and other snacks from their packaging as well as the noise of people consuming the snacks is responsible for a large amount of ambient noise during theater viewing. Audience members coughing, whispering, throat-clearing, adjusting seats and posture and more further contribute to ambient noise. The ambient noise creates an audio environment present inside the theater that is non-optimal at best and highly distracting and unenjoyable at worst.

Another major recent concern is that stereo sound systems and subwoofer systems have led to cinemas playing the soundtracks of films at unacceptably high volume levels. Movie trailers shown before the film starts are presented at a very high sound level (i.e., presumably to overcome the sounds of a busy crowd). The sound level is not adjusted downward for a sparsely occupied theater. Volume is normally adjusted based on the judgment of a projectionist for a high or low attendance. The film is then shown at a lower volume level than the trailers. Despite audience complaints, movie theaters have said that the studios set trailer sound levels, not the theater. Similarly, music concerts are often played at such high volumes that hearing protection is often recommended. The attendees have no control over sound levels.

It would be desirable to implement theater noise canceling headphones.

SUMMARY

The invention concerns a system comprising an audio broadcast device, headphones and an interface device. The audio broadcast device may be configured to generate a plurality of audio tracks. The headphones may be configured to perform noise cancellation of ambient audio, decode one of the plurality of audio tracks selected by a user and playback a personalized audio track in response to the selected audio track and user settings. The interface device may be configured to receive the user settings and enable the user to select one of the audio tracks. The headphones may receive the selected audio track from the audio broadcast device in response to the selection using the interface. The user settings may be applied to the selected audio track to generate the personalized audio track.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing theater noise canceling headphones that may (i) reduce an impact of ambient noise on presented audio, (ii) enable users to personalize an audio stream, (iii) provide an interface for personalization, (iv) enable users to communicate without disturbing other viewers, (v) enable users to find other viewers with similar preferences, (vi) intelligently suppress sounds based on user feedback and/or (vii) be implemented as one or more integrated circuits.

Embodiments of the present invention may implement a system that enhances the audio experience through a reduction in ambient noise at an event and/or a personalization of an audio track. In one example, the audio track may be for a film viewed in a movie theater. In another example, the audio track may be for a live concert. The system may provide users with a mechanism that cancels and/or filters as much ambient noise at an event as possible so that the desired audio track may be heard and enjoyed with a minimum of distraction or interference. The type of audio and/or event implementing the present invention may be varied according to the design criteria of a particular implementation.

Figure 1:
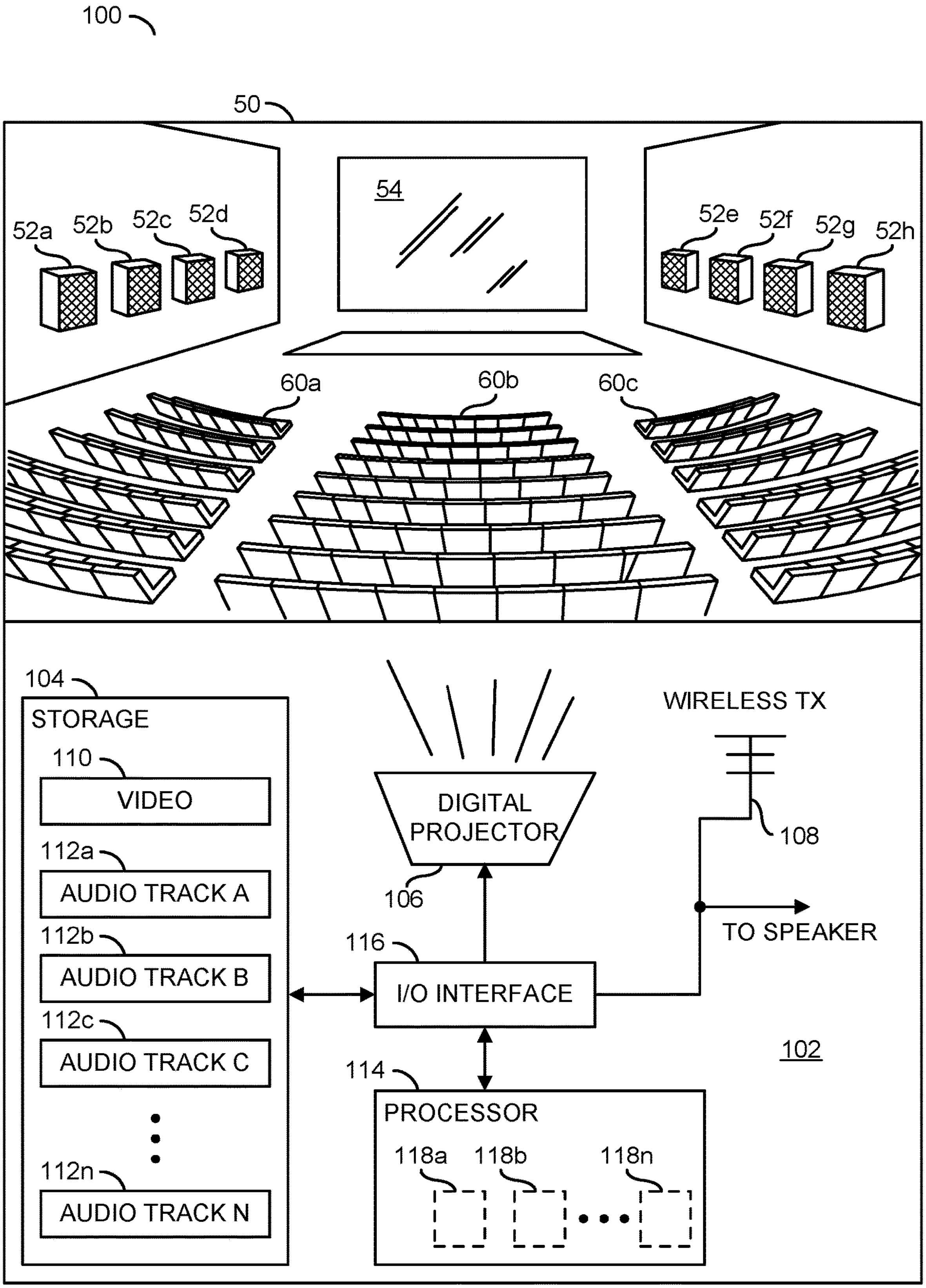
FIG. 1 is a diagram illustrating an example implementation of the present invention.

Referring to FIG. 1, a diagram illustrating an example implementation of the present invention is shown. A system 100 is shown. The system 100 may be implemented in a venue 50. For example, the venue 50 may be a movie theater, a concert hall, an auditorium, etc. In the example shown, the system 100 may be implemented in the context of a movie theater 50. The movie theater 50 may comprise audio output devices 52*a*-52*h*, a movie screen 54 and seating areas 60*a*-60*c*. The audio output devices 52*a*-52*h* may be configured to playback an audio stream to the audience. The video screen 54 may be configured to show video (e.g., a movie). In an example, the audio stream presented by the speakers 52*a*-52*h* may be synchronized with the video displayed on the movie screen 54. The seating area 60*a*-60*c* may provide row seating for audience members. Since the seating area 60*a*-60*c* provides many seats in an open area, the audience members may create ambient noise that may interference with the audio stream presented by the speakers 52*a*-52*h*.

The system 100 may comprise a broadcast device 102. In one example, the broadcast device 102 may be an audio broadcast device configured to generate multiple audio tracks/streams. In another example, the broadcast device 102 may be an audio/video broadcast device configured to provide video as well as audio streams. In the movie theater context 50 shown, the broadcast device 102 may implement the audio/video broadcast device.

The broadcast device 102 may comprise a block (or circuit) 104, a block (or circuit) 106 and/or a block (or circuit) 108. The circuit 104 may implement storage. The circuit 106 may implement a video projector. The circuit 108 may implement a communication device. The broadcast device 102 may comprise other components (not shown). The number, type and/or arrangement of the components of the broadcast device 102 may be varied according to the design criteria of a particular implementation.

The storage device 104 may comprise a block (or circuit) 110 and/or blocks (or circuits) 112*a*-112*n*. The block 110 may be video data. The blocks 112*a*-112*n* may be audio tracks/streams. Each of the audio streams 112*a*-112*n* may correspond to the video data 110. In one example, the video data 110 may be a movie (e.g., a motion picture film) and the audio streams 112*a*-112*n* may be different audio tracks (e.g., multiple languages, an uncensored version, a censored version, a commentary track, etc.) for the video data 110. For example, the audio track 112*a* may be an English language audio track for the movie 110, the audio track 112*b* may be a French language audio track for the movie 110, the audio track 112*c* may be an Italian language audio track for the movie 110, etc.

The broadcast device 102 may further comprise a block (or circuit) 114 and/or a block (or circuit) 116. The circuit 114 may implement a processor. The circuit 116 may implement an input/output interface. The processor 114 may comprise blocks (or circuits) 118*a*-118*n*. The circuits 118*a*-118*n* may implement various modules of the processor 114. The number, type and/or functionality of the modules 118*a*-118*n* of the processor 114 may be varied according to the design criteria of a particular implementation.

The processor 114 may be configured to execute computer readable instructions. The instructions, when executed by the processor 114, may perform a number of steps. The processor 114 may be configured to receive input, generate output and/or perform operations on data based on the steps of the computer readable instructions.

The storage 104 may be configured to implement a memory. The storage 104 may store the computer readable/executable instructions and/or firmware (not shown). The storage 104 may store computer readable data (e.g., the video data 110 and/or the audio tracks 112*a*-112*n* and/or other data such as user profiles). The storage 104 may be implemented as a volatile memory, a non-volatile memory and/or a combination of volatile memory and non-volatile memory. In one example, the storage 104 may implement a cache for the processor 114. In another example, the storage 104 may implement RAM. In yet another example, the storage 104 may implement a hard drive and/or solid state drive and/or an array of hard drives and/or solid state drives. The implementation of the storage 104 and/or the type of data stored by the storage 104 may be varied according to the design criteria of a particular implementation.

The input/output (I/O) interface 116 may be configured to send and/or receive data. The I/O interface 116 may be configured to enable various components of the broadcast device 102 to communicate data. The I/O interface 116 may be configured to enable the broadcast device 102 to receive data from an external source.

The modules 118*a*-118*n* may be configured to implement various functionality of the processor 114. In one example, the module 118*a* may be configured to implement machine learning. For example, the machine learning module 118*a* may be configured to analyze audio data from the audio tracks 112*a*-112*n* to detect and/or flag various types of sounds. The machine leaning module 118*a* may be configured to determine sounds that are similar (e.g., identify all the gunfire sounds in the audio tracks 112*a*-112*n*).

The digital projector 106 may be configured to receive the video data 110 from the storage device 104. For example, the processor 114 may be configured to access the storage 104 via the I/O interface 116 to retrieve the video data 110. The video track 110 may be transmitted to the digital projector 106 using the I/O interface 116. The digital projector 106 may be configured to playback the video data 110. The digital projector 106 may playback the video data 110 by projecting the movie onto the screen 54.

The communication device 108 may be configured to transmit and/or receive data to/from an external device. The communication device 108 may be configured to communicate using various wired and/or wireless protocols (e.g., Ethernet, Wi-Fi, Bluetooth, etc.). In an example, the communication device 108 may be connected to an external server computer (e.g., to receive digital movies from a distributor). The type of data communicated from and/or received by the communication device 108 may be varied according to the design criteria of a particular implementation.

The communication device 108 may be configured to communicate one or more of the audio tracks 112*a*-112*n*. For example, the processor 114 may be configured to access the storage 104 via the I/O interface 116 to retrieve one or more of the audio tracks 112*a*-112*n*. The audio tracks 112*a*-112*n* may be transmitted to the communication device 108 using the I/O interface 116. In some embodiments, the communication device 108 may be connected to the speakers 52*a*-52*h*. In one example, the communication device 108 may comprise a wired connection. For example, the wired connection may be used to connect the communication device 108 to the speakers 52*a*-52*h*. In some embodiments, the communication device 108 may comprise an antenna to implement wireless communication. The antenna may be configured to enable the communication device 108 to transmit one or more of the audio streams 112*a*-112*n* wirelessly.

The communication device 108 may be configured to send digital audio not only to the theater sound system (e.g., the speakers 52*a*-52*h*) but also to the headset distribution system. In the example shown, the headset distribution system is implementing a wireless transmission. In some embodiments, the headset distribution system may be wired connection (e.g., a wired connection to each of the seats in the seating areas 60*a*-60*c*).

Figure 2:
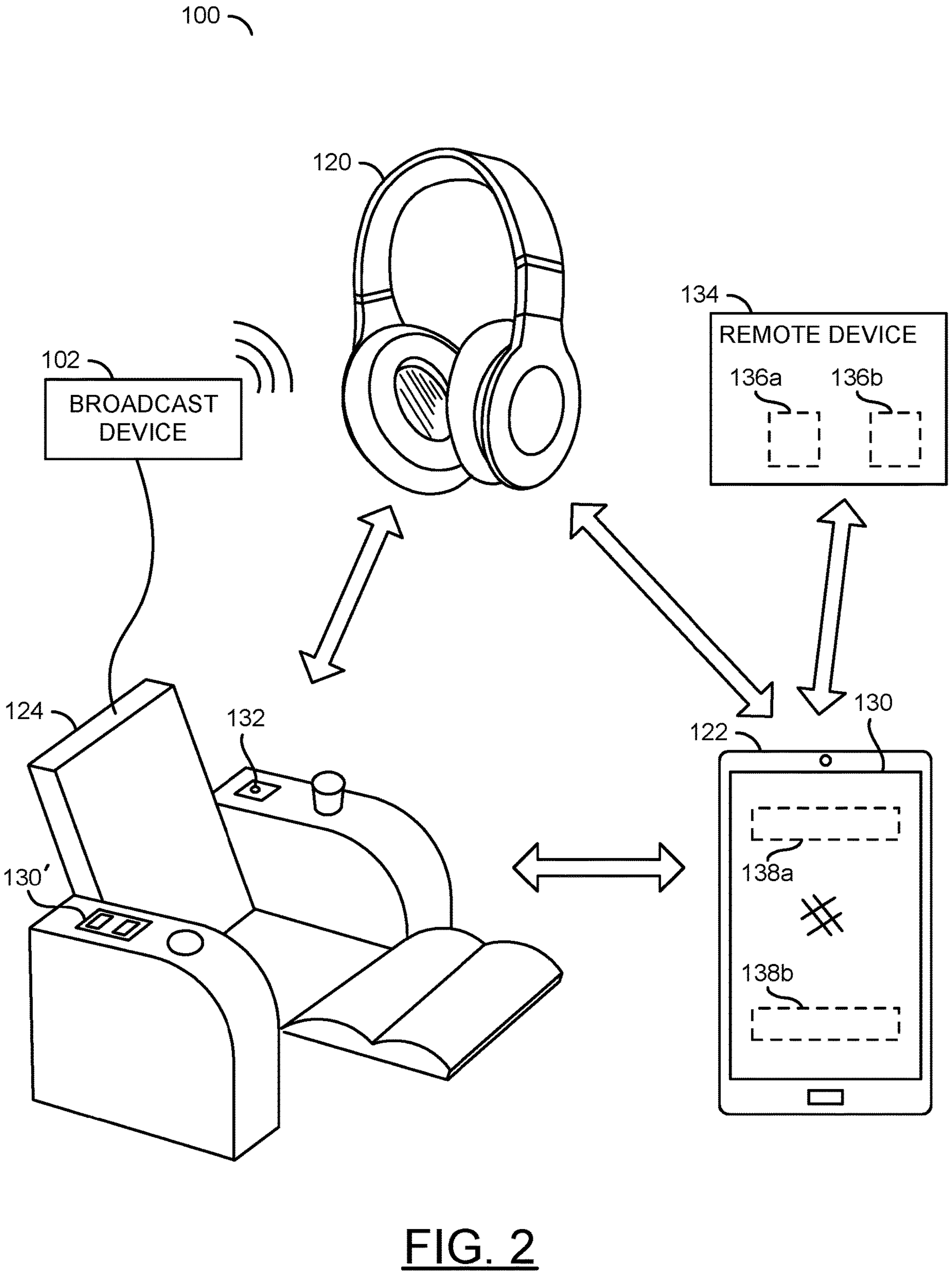
FIG. 2 is a diagram illustrating example components of a system implementing the present invention.

Referring to FIG. 2, a diagram illustrating example components of the system 100 implementing the present invention is shown. The broadcast device 102 is shown as a component of the system 100. The system 100 may further comprise a pair of headphones 120, a user device 122 and/or a seat 124. The system 100 may comprise other components (not shown). In some embodiments, one or more of the user device 122 and/or the seat 124 may be optional. The number and/or types of components implemented by the system 100 may be varied according to the design criteria of a particular implementation.

In the example shown, the broadcast device 102 is shown communicating wirelessly. For example, the broadcast device 102 may be configured to wirelessly communicate (e.g., Wi-Fi, Bluetooth, etc.) with one or more of the headphones 120, the user device 122 and/or the seat 124. In the example shown, the broadcast device 102 is shown implementing a wired connection with the seat 124. The wired connection with the seat 124 is shown as a representative example. For example, a wired connection may be implemented between the broadcast device 102 and one or more of the headphones 120, the user device 122 and/or the seat 124.

The headphones 120 may be worn by a user/attendee (e.g., an audience member) to enable the user to listen to a personalized audio track. The headphones 120 may be configured to implement noise canceling. The noise canceling may reduce and/or eliminate ambient noise. The headphones 120 may be configured to playback the personalized audio track for a user. The personalized audio track may be a modified version of a selected one (or more) of the audio tracks 112*a*-112*n*. The headphones 120 may receive the selected audio tracks 112*a*-112*n* and decode the selected audio tracks 112*a*-112*n* for playback. The headphones 120 may be configured to adjust the selected audio track(s) in response to user settings.

The smartphone 122 is shown having an interface 130. The interface 130 may provide various settings and options. In an example, the interface 130 may be a graphical user interface (GUI) for an app associated with the venue 50. In some embodiments, the smartphone 122 may be configured to connect to the broadcast device 102. For example, the smartphone 122 may receive the audio tracks 112*a*-112*n* from the broadcast device 102, decode the audio tracks 112*a*-112*n* (e.g., using the smartphone DAC) and then provide the decoded audio to the headphones 120 (e.g., using a wired or wireless connection).

The smartphone 122 may be owned by the user. For example, the smartphone 122 may not be provided by the venue 50. Each user may bring the smartphone 122 to the venue 50 and use the interface 130 to utilize the features of the system 100.

The seat 124 may comprise the interface 130'. The interface 130' may have an implementation similar to the interface 130 of the smartphone 122. In one example, the interface 130' may be a touchscreen interface built into the seat 124. Implementing the interface 130' on the seat 124 may ensure that attendees at the venue 50 do not need to bring the smartphone 122 (or other personal devices). For example, with the interface 130', the venue 50 may have full control over the usage of the system 100 (e.g., users could utilize the system 100 without prior setup of the smartphone 122 such as downloading an app). Implementing the interface 130' on the seat 124 may provide an easy to troubleshoot implementation of the system 100.

An audio connector 132 is shown on the seat 124. The audio connector 132 may provide an audio output jack to enable a wired connection to the headphones 120. For example, the broadcast device 102 may provide the audio tracks 112*a*-112*n* to the seat 124 and the audio connector 132 may be used to provide the audio tracks 112*a*-112*n* to the headphones 120.

The seat 124 may be implemented throughout the seating areas 60*a*-60*n* (e.g., multiple implementations of the seat 124 may be in the venue 50). In the example shown, the broadcast device 102 may be connected to the seat 124 with a wired connection. For example, the infrastructure of the venue 50 may provide wired connections to each seat 124 in the seating areas 60*a*-60*n*. The wired connection may provide the audio tracks 112*a*-112*n*. In some embodiments, the broadcast device 102 may provide the audio tracks 112*a*-112*n* to the seat 124 via a wireless connection and the user may connect the headphones 120 to the seat 124 to listen to the audio selected using the interface 130' via the audio connector 132. In some embodiments, the broadcast device 102 may wirelessly provide the audio tracks 112*a*-112*n* to the headphones 120 and the seat 124 may be a generic seat (e.g., the interface 130' and/or the audio connector 132 may not be implemented on the seat 124).

In some embodiments, the interface 130 may be implemented using the smartphone 122. In some embodiments, the interface 130' may be implemented on the seat 124. In some embodiments, the interface 130 may be provided by the headphones 120. Implementing the interface 130 on a particular device (e.g., the headphones 120, the smartphone 122, the seat 124, another type of device, etc.) may be optional. The devices used to implement the interface 130 and/or the interconnection of the headphones 120 to the broadcast device 102 to receive the audio tracks 112*a*-112*n* may be varied according to the design criteria of a particular implementation.

The ubiquity of reasonably priced consumer devices such as the noise canceling headphones 120 and the smartphone 122 combined with low latency synchronizing audio technologies may provide a low-cost implementation of the system 100. The system 100 may provide a better overall auditory experience.

Many event venues, such as movie theaters are designed for volume attendance. In the example of a movie theater, the film (e.g., the video data 110) may only be shown in one language using the screen 54 and the speakers 52*a*-52*h*. Alternate languages may be provided using subtitles, but alternate language subtitles may be obtrusive to the majority of attendees. With many people attending each movie screening, the traditional approach for showing a film may not accommodate the native language of each attendee. The system 100 may enable one or more of the audio tracks 112*a*-112*n* to be selected by each attendee. For example, the audio tracks 112*a*-112*n* may provide alternate language audio tracks and each attendee may select a desired (e.g., native) language.

Each attendee may use the interface 130 to select from the audio tracks 112*a*-112*n*. In one example, each attendee may select a different one of the audio tracks 112*a*-112*n*. In another example, each attendee may select more than one of the audio tracks 112*a*-112*n*. The broadcast device 102 may transmit the selected audio tracks 112*a*-112*n* (e.g., a personalized audio track) to the headphones 120 worn by the attendee that selected the audio track. In some embodiments, the interface 130 may be used to select audio settings (e.g., volume, treble, bass, loudness normalization, etc.) to further personalize the selected audio tracks. The system 100 may output personalized audio to enable one event (e.g., one movie screening) to accommodate the preferences of each attendee without needing to show the film at different times/locations with each viewing offering a specific language. The system 100 may be configured to enable each user to have the ability to individually choose the audio track (e.g., without affecting the audio track selected by another user). For example, many people may be at the same venue 50, viewing the same film and enjoying the film in a preferred language and dialect. In another example, one or more of the audio tracks 112*a*-112*n* may be a commentary track (e.g., director commentary, actor commentary, etc.). Providing commentary tracks may encourage people to view the film multiple times (e.g., watch the film a first time in the native language and then watch again to listen to the commentary).

The audio tracks 112*a*-112*n* may be further personalized. For example, some audience members may be sensitive to high volume levels and may desire to have the overall volume level muffled (e.g., or some effects such as explosions muffled, or particular sequences muffled). Medical conditions and/or personal preferences may cause some audience members to prefer different frequencies of sounds enhanced, muffled or muted. For example, some viewers may prefer to have lower pitched male voices augmented but muffle the higher pitch of female or child voices. Some viewers may find certain sounds disturbing, unpleasant and/or offensive (e.g., profanity, gun and canon blasts, dogs barking, monsters growling, etc.). The system 100 may enable the attendees to use the interface 122 to personalize the audio tracks 112*a*-112*n*.

Since smartphones are ubiquitous, smartphones are being utilized by major theater chains. For example, theater companies have specialized apps that allow users to purchase tickets, select seats, pre-order refreshments, etc. The interface 122 may be implemented as part of a movie theater app. The interface 122 may supplement the movie theater app to enable the users to improve the audio experience for movie theaters. The system 100 may provide audio enhancement and/or personalization for movie theater patrons.

The system 100 may be implemented with numerous variations and/or sub-variations. In one example, the headphones 120 may be owned and maintained by the venue 50 and loaned/rented to the customers before each viewing and then returned after the movie has completed as the customer is exiting the venue 50. The headphones 120 may be wired or wireless. The implementation where the headphones 120 are owned by the venue 50 may be a similar model to how 3D glasses are distributed and collected for 3D films. In one example, for implementations where the headphones 120 are wired, the headphones 120 may connect to the audio connector 132 to receive the audio tracks 112*a*-112*n*. In another example, for implementations where the headphones 120 are wired, the headphones 120 may connect to the smartphone 122 to receive the audio tracks 112*a*-112*n*.

In another example variation of the system 100, the headsets 120 may be brought by the attendee. For example, the headsets 120 may have a 3.5 mm headphone jack (or similar) that attaches to the audio connector 132 and/or another audio connector near where the attendee is seated. The digital video 110 may be sent via wired technology to the digital projector system 106. The processor 114 may be configured to generate the digital encoded audio portion. The I/O interface 116 may transmit the digital encoded audio portion in parallel with the video 110 to the sound system 52*a*-52*h* and to each one of the seats 124 in the venue 50.

The processor 114 may be configured to synchronize the communication of the selected audio tracks to each of the headsets 120 with the playback of the video track 110. The synchronization may be implemented to ensure that the audio communicated does not lag or lead the film (e.g., prevent the audio from being out of sync with the lips of the actors). In some embodiments, when the communication of the audio tracks 112*a*-112*n* is performed wirelessly, the processor 114 may slightly delay the broadcast of the video track 110 to provide sufficient time for any communication delay of the audio tracks 112*a*-112*n*.

The system 100 may further comprise a block (or circuit or module or device) 134. The device 134 may implement a remote device. In one example, the remote device 134 may be a server computer. In some embodiments, the remote device 134 may be at a location separate from the venue 50. The remote device 134 is shown communicating with the smartphone 122. However, the remote device 134 may be further configured to communicate with the broadcast device 102 and/or the headphones 120. The implementation of the remote device 134 may be varied according to the design criteria of a particular implementation.

The remote device 134 may comprise a block (or circuit) 136*a* and/or a block (or circuit) 136*b*. The circuit 136*a* may implement processor. The circuit 136*b* may implement a memory. The remote device 134 may comprise other components (not shown). The processor 136*a* may be configured to execute computer readable instructions. The instructions, when executed by the processor 136*a*, may perform a number of steps. The processor 136*a* may be configured to receive input, generate output and/or perform operations on data based on the steps of the computer readable instructions.

The memory 136*b* may be configured to store the computer readable instructions and/or other types of data. In one example, the memory 136*b* may store one or more of the video data 110 and/or the audio tracks 112*a*-112*n*. For example, the remote device 134 may be implemented by a movie distributor. The remote device 134 may provide the video data 110 and/or the audio tracks 112$a$-112$n$ to the broadcast device 102.

In another example, the memory 136$b$ may be configured to store user profiles for various users. For example, each user of the system 100 may be able to create an individual user profile. The user profile may store preferences (e.g., preferred language selection from the audio tracks 112$a$-112$n$, types of audio to mute, level of profanity to allow, etc.). The user profiles in the memory 136$b$ may be used by a companion application operating on the smartphone 122.

The user device 122 may comprise blocks (or circuits) 138$a$-138$b$. The circuit 138$a$ may implement a processor. The circuit 138$b$ may implement a memory. The user device 122 may comprise other components (e.g., a wireless communication module, a touchscreen interface, a speaker, a microphone, etc.). The components of the user device 122 may be varied according to the design criteria of a particular implementation.

The processor 138$a$ may be configured to execute computer readable instructions. The instructions, when executed by the processor 138$a$, may perform a number of steps. The processor 138$a$ may be configured to receive input, generate output and/or perform operations on data based on the steps of the computer readable instructions. The memory 138$b$ may be configured to store the computer readable instructions and/or other types of data.

The processor 138$a$ and the memory 138$b$ may be configured to generate the interface 130. In an example, components similar to the processor 138$a$ and the memory 138$b$ may be implemented by the seat 124 to generate the interface 130'. The processor 138$a$ and the memory 138$b$ may be configured to implement a companion application. The companion application may be configured to accept input from the users and/or enable the users to adjust various settings. The companion application may comprise computer executable instructions that may be performed by the processor 138$a$ and stored by the memory 138$b$. The companion application may be configured to interact with the remote device 134. In one example, the companion application may provide an interface for adjusting the user preferences stored in the memory 136$b$ of the remote device 134. Details of the companion application may be described in association with FIGS. 8-18.

Figure 3:
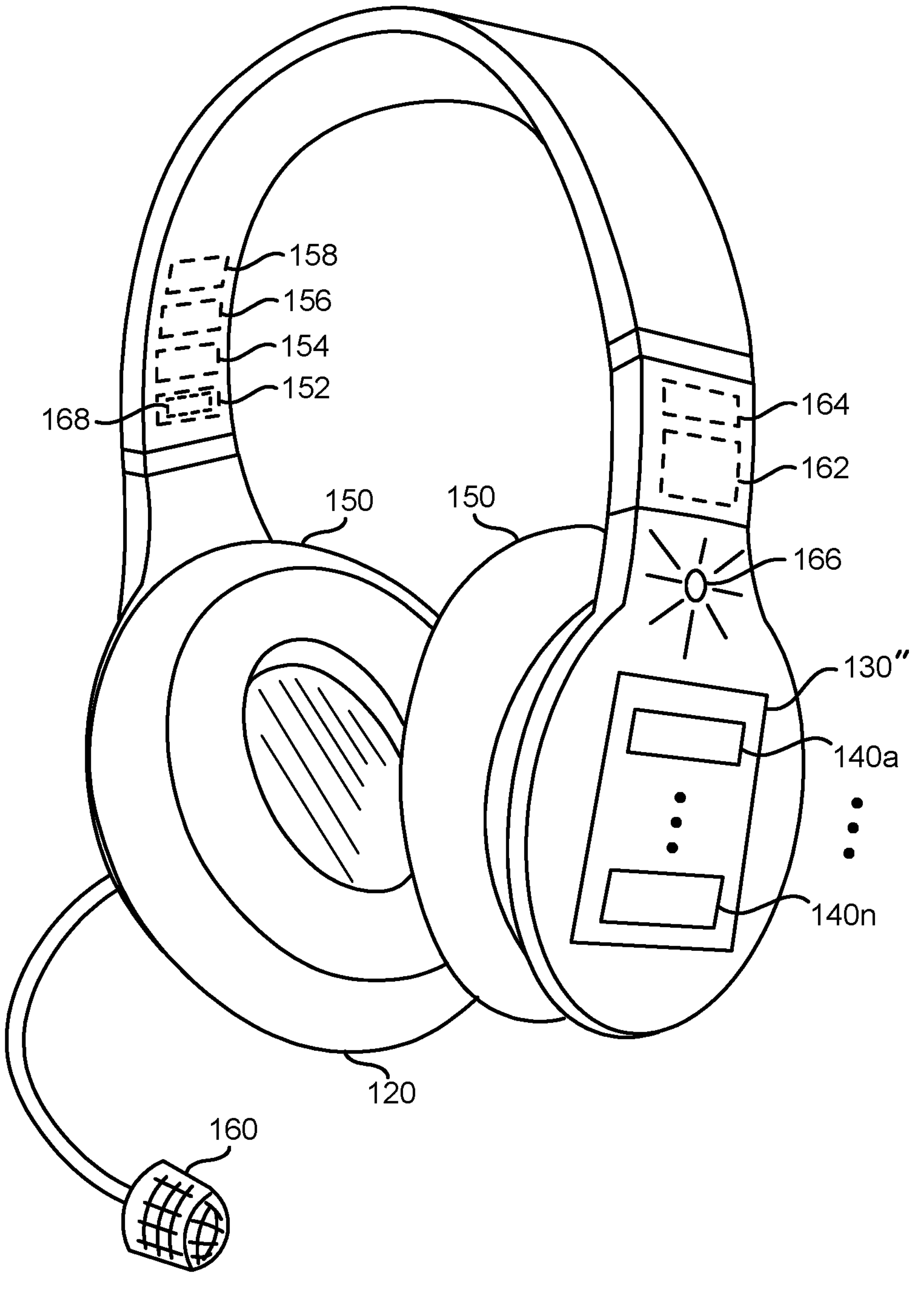
FIG. 3 is a diagram illustrating an example implementation of noise-canceling headphones for the system.

Referring to FIG. 3, a diagram illustrating an example implementation of the noise-canceling headphones 120 for the system 100 is shown. The example headphones 120 are shown having an overhead (or headband) design with over-the-ear speakers. Generally, over-the-ear speakers provide better noise-cancellation by muffling ambient noise. The style of the headphones 120 may be varied according to the design criteria of a particular implementation.

In the example shown, the interface 130" is shown implemented on the headphones 120. Implementing the interface 130" on the headphones 120 may be optional (e.g., alternate variations of the system 100 may have the interface 130 provided by the smartphone 122 or the interface 130' provided by the seat 124). A number of buttons 140$a$-140$n$ are shown on the interface 130". The buttons 140$a$-140$n$ may enable the user to provide input to the system 100. In an example, the buttons 140$a$-140$n$ may be physical switches (e.g., since the user may not be able to see touchscreen software buttons when wearing the headphones 120).

The headphones 120 may comprise speakers 150. In the example shown, the speakers 150 may comprise two over-the-ear cups. The speakers 150 may be configured to playback the audio (e.g., one or more of the audio tracks 112$a$-112$n$ that have been selected).

The headphones 120 may comprise a block (or circuit) 152, a block (or circuit) 154, a block (or circuit) 156 and/or a block (or circuit) 158. The circuit 152 may implement a noise cancellation module. The circuit 154 may implement an audio decoder. The circuit 156 may implement a motion sensing module. The circuit 158 may implement a wireless communication module. The headphones 120 may comprise other components. The number, type and/or arrangement of the components of the headphones 120 may be varied according to the design criteria of a particular implementation.

The noise cancellation module 152 may be configured to perform noise cancellation of ambient audio. The noise cancellation module 152 may eliminate and/or reduce ambient audio heard by the user when wearing the headphones 120. Canceling the ambient audio may enable the user to listen to the selected audio tracks 112$a$-112$n$ with fewer distractions.

The audio decoder 154 may be configured to decode the audio tracks 112$a$-112$n$ that have been selected. For example, the audio broadcast device 102 may communicate one (or more) of the audio tracks 112$a$-112$n$ to the headphones 120 in an encoded format. The audio decoder 154 may decode the audio to an analog format to be played back by the speakers 150.

The audio decoder 154 may be configured to adjust the received (e.g., selected) audio tracks 112$a$-112$n$. Adjusting the audio tracks 112$a$-112$n$ that have been received may provide a personalized audio track to the user. The adjustments may be performed in response to preferences of the user. In one example, the user may use the buttons 140$a$-140$n$ to lower a bass level of the selected audio tracks 112$a$-112$n$. In another example, the audio decoder 154 may perform a loudness equalization on the selected audio tracks 112$a$-112$n$ in response to a user input. The types of adjustments performed by the audio decoder 154 may be varied according to the design criteria of a particular implementation.

The motion sensing module 156 may comprise various components used to detect motion and/or orientation of the headphones 120 (e.g., to be used as an approximation of the movement of the head of the user). The motion sensing module 156 may comprise one or more of a gyroscope, an accelerometer, a magnetometer and/or a proximity sensor. For example, the motion sensing module 156 may be configured to determine whether the orientation of the headphones 120 indicate that the user is facing the screen 54. In another example, the motion sensing module 156 may be configured to determine that a user has turned to look at an adjacent attendee (e.g., to initiate a conversation). The proximity sensory may be configured to determine a distance between the headphones 120 and another pair of the headphones 120. For example, based on a reading from the proximity sensor, the motion sensor module 156 may determine that the user had leaned closer to an adjacent attendee (e.g., to initiate a conversation without looking directly at the adjacent attendee).

The wireless communication module 158 may be configured to communicate data using one or more wireless protocols. The wireless communication module 158 may be configured to receive the selected audio tracks 112$a$-112$n$ from the broadcast device 102. The wireless communication module 158 may be configured to connect to the smartphone 122. For example, the headphones 120 may pair with the smartphone 122 to enable the interface 130 to control the audio played by the headphones 120. The wireless communication module 158 may be an optional component. For example, a wired connection may be used instead of, or in addition to, wireless communication. In one example, the wireless communication module 158 may implement Wi-Fi. In another example, the wireless communication module 158 may implement Bluetooth. The type(s) of communication protocols implemented by the wireless communication module 158 may be varied according to the design criteria of a particular implementation.

The headphones 120 may further comprise a microphone 160. In the example shown, the microphone 160 is shown implemented as a boom microphone (e.g., that may swivel up and down from the headband to a position in front of the mouth of the user). The microphone 160 may be configured to receive audio input. For example, the user of the headphones 120 may speak into the microphone 160. The audio input received by the microphone 160 may enable the user of the headphones 120 to speak to another user of the headphones 120 without disturbing other audience members. The headphones 120 may further comprise a block (or circuit) 162, a block (or circuit) 164 and/or a block (or circuit) 166. The circuit 162 may implement a processor. The circuit 164 may implement a memory. The circuit 166 may implement a light emitting element (e.g., an LED). The processor 162 may be configured to execute computer readable instructions. The instructions, when executed by the processor 162, may perform a number of steps. The processor 162 may be configured to receive input, generate output and/or perform operations on data based on the steps of the computer readable instructions.

The memory 164 may be configured to store the computer readable instructions and/or other types of data. In one example, the memory 166 may store one or more of the audio tracks 112*a*-112*n* and/or audio messages. Storing one or more of the audio tracks 112*a*-112*n* may provide the audio data for the decoder 154. Storing more than one of the audio tracks 112*a*-112*n* may enable the processor 162 to switch between the audio tracks to provide to the decoder 154 seamlessly (e.g., prevent gaps in audio when changing audio track selection). In one example, the memory 166 may operate as a memory buffer for the audio messages. The audio messages may be audio of spoken words (e.g., captured by the microphone 160) transmitted from the headset 120 of one user to the headset 120 of another user.

The light 166 may provide a visual indicator. The visual indicator provided by the light 166 may be a notification that the audio message has been received. For example, the audio message may be transmitted by one of the headsets 120 to another of the headsets 120 and stored by the memory 164. When the audio message is stored by the memory 164, the light 166 may turn on to indicate that the audio message has been received (e.g., to notify the user that the audio message is available for playback). Similarly, the light 166 may notify the user that sent the audio message that the audio message has been received, but has not been heard yet.

The noise cancellation module 152 may comprise a block (or circuit) 168. The circuit 168 may implement a sampling microphone. The sampling microphone 168 may be configured to sample audio of the environment (e.g., the ambient audio). Sampling the ambient audio using the microphone 168 may provide a reference for the noise cancellation performed by the noise cancellation module 152. In some embodiments, the sampling microphone 168 may be used to capture the audio messages (e.g., instead of implementing the boom microphone 160).

The headphones 120 may be configured to perform noise cancellation. The noise cancellation module 152 may provide the ability to filter out ambient noise at a reasonable price. The noise cancellation module 152 may analyze incoming noise patterns captured by the sampling microphone 168 and apply an alternate waveform to muffle the ambient noise. In the example shown, the headphones 120 may communicate wirelessly (e.g., using the wireless communication module 158). In some embodiments, the headphones 120 may implement a wired connection (e.g., to connect to the smartphone 122 and/or the audio connector 132). For example, modern smartphone ecosystems have a wide array of smartphone applications that allow users to choose music, calming sound patterns, sound effects, etc. from cloud based and/or local libraries and may playback the audio decoded by a DAC of the smartphone 122. In some embodiments, the audio tracks 112*a*-112*n* may be decoded by the smartphone 122 and presented to an audio output peripheral (e.g., a 3.5 mm jack, a Bluetooth connection, etc.) to provide the decoded audio to the headphones 120.

The user may connect the headphones 120 to the broadcast device 102 (e.g., by jacking in (plugging in) to the audio connector 132, using the wireless communication module 158, via the smartphone 122, etc.). In one example, the buttons 140*a*-140*n* of the interface 130" may provide controls. In another example, the interface 130' on the seat 124 may provide controls for the user. In yet another example, the interface 130 on the smartphone 122 may provide controls. The controls implemented by the buttons 140*a*-140*n* may comprise volume, bass, treble, language, etc. More sophisticated controls may be available on the touch pad 130' in the seat 124 (e.g., on the back of the seat 124 in front of the user, on an armrest of the seat 124, in front of the seat 124 of the user, etc.). Similarly, sophisticated controls may be implemented by the interface 130 operating as a smartphone app. In some embodiments, the audio tracks 112*a*-112*n* may be presented to the headphones 120 via a wired connection (e.g., to the audio connector 132) and the interface 130 from the smartphone 122 may be connected wirelessly to the system 100 to provide the controls. For example, the headset 120 may accept a control signal (from the smartphone 122) as well as the digital audio signal for the audio tracks 112*a*-112*n* from the wired connection. The audio decoder 154 may decode the audio tracks, the noise cancellation module 152 may perform the noise cancellation and then present the personalized audio to the noise canceling speakers 150 in the headphones 120.

In some embodiments, the system 100 may be implemented without the smartphone 122. For example, the headphones 120 may comprise the microphone 160, the two ear pieces with the speakers 150, the wireless audio receiving hardware 158, the audio decoding hardware 154, the noise canceling hardware 152, the control buttons 140*a*-140*n*, the processor 162 and the memory 164. For example, the buttons 140*a*-140*n* may provide input to the processor 162 for enabling control for volume, bass, treble, selecting several alternative language channels, enable/disable offensive sound button, etc. The headphones 120 may receive the audio tracks 112*a*-112*n* via a connection to the broadcast device 102 as part of the theater sound distribution system and/or as a low latency wireless network connection.

In some embodiments, the buttons 140*a*-140*n* may comprise an audio tagging button. The audio tagging button may enable the user to identify audio (e.g., an audio clip, a portion of the audio tracks 112*a*-112*n*, etc.). In an example, the audio tagging button may be used to enable the user to identify sounds that the user finds undesirable (e.g., offensive sounds, obtrusive sounds, etc.) in real-time. The noise cancellation module 152 may be configured to mute, muffle and/or replace the sounds that have been identified using the audio tagging button. Audio clips that are tagged using the audio tagging button may be stored in the memory 164, analyzed using the noise cancellation module 152 and/or uploaded to the remote device 134. For example, each user may have an account stored in the memory 136*b* of the remote device 134 that stores audio that has been tagged as undesirable by the particular user. After an audio clip has been tagged, the noise cancellation module 152 may monitor the selected audio tracks 112*a*-112*n* to adjust future instances of audio that is similar to the tagged audio clip. The tagged audio clips may be received by the headphones 120 from the remote device 134 based on the data stored in the user account. For example, while watching a space battle scene in a movie, a particular user may become distressed by the sound of laser blasters. In one example, by pressing the audio tagging button when there is a laser blaster sound, the noise cancellation module 152 may analyze the audio clip of the laser blaster sound, then monitor for the next time a similar laser blaster sound occurs to muffle and/or mute the laser blaster sound. In another example, by pressing the audio tagging button when there is a laser blaster sound, the wireless communication module 158 may upload the audio to the remote device 134 and the processor 136*a* may analyze the audio clip of the laser blaster sound, then monitor for the next time a similar laser blaster sound occurs to muffle and/or mute the laser blaster sound (e.g., provide time stamps). The time stamps may be sent to the headphones 120 and the noise cancellation module 152 may be configured in response to the time stamps.

In some embodiments, one of the buttons 140*a*-140*n* may implement a mute button. The mute button may silence the personalized audio playback by the speakers 150. The mute button may further cancel the noise cancellation of the ambient noise by the noise cancellation module 152. In one example, silencing the audio playback and stopping the noise cancellation of the ambient noise may enable the user to hear the voice incoming from a neighbor and/or a voice over an intercom. In another example, if the headphones are connected to the smartphone 122, the mute button may silence all audio (e.g., the personalized audio playback) except for audio selected by the user for other apps and/or features on the smartphone 122 (e.g., playing back a voice mail and/or using text-to-speech to read back an text message).

The buttons 140*a*-140*n* may provide controls to alter the incoming digital audio of the selected audio tracks 112*a*-112*n*. For example, the attendee may not like the audio mix of a movie (e.g., in an action sequence the sound effects such as explosions are too loud and the dialogue is drowned out). In the example, the controls may be used to alter the selected audio tracks 112*a*-112*n* to mute all sounds except the dialogue to enable the user to better follow the script of the movie. In another example, the controls may comprise a dial that may be configured to turn the audio for the voices up and other sound effects down to provide an analog feel to tuning the audio. The types of modifications to the incoming audio that are implemented by the controls may be varied according to the design criteria of a particular implementation.

The headphones 120 may be configured to communicate control signals directly (e.g., peer-to-peer, point-to-point, etc.) to other headphones 120 in the venue 50. The headphones 120 may be configured to communicate the control signals via proxy (e.g., via the system 100) to other headphones 120 in the venue 50. For example, the communication of the control signals by proxy may be implemented if the theater has knowledge of the placement of each headset system either by mapping the headset IDs to the seating map and/or through any combination of indoor location technologies (e.g., the processor 114 may perform the mapping and the storage 104 may store the seating map).

The motion sensing module 156 may comprise a number of sensors that enable the system 100 to have knowledge of the positioning of the headsets 120 relative to the movie screen 54, the smartphone 122 and/or other of the headsets 120. The motion sensing module 156 may comprise one or more of a gyroscope, an accelerometer, a magnetometer and/or a proximity sensor. Based on the movement information generated by the motion sensing module 156, the headset 120 may track the movement of the headset 120 and perform different behaviors depending on the movement detected. In one example, if the motion detected indicates that the headphones 120 have turned towards another set of the headphones 120, the headphones 120 may be configured to transmit captured audio from the microphone 160.

The noise cancellation module 152 may be tuned for different environments. In some embodiments, the noise cancellation module 152 may be tuned for ambient noise common in a movie theater (e.g., voices, chewing/crunching, plastic packages crinkling, etc.). In some embodiments, the noise cancellation module 152 may be tuned for engine sounds (e.g., for use in an airplane). In some embodiments, the noise cancellation module 152 may be configured to cancel some types of ambient audio (e.g., human voices) and enhance other types of ambient audio (e.g., sounds generated by competitors at a sporting event such as skates cutting the ice, the swish of a basketball net, the impact of competitors colliding, etc.). For example, the buttons 140*a*-140*n* may comprise controls configured to toggle the type of noise cancellation performed by noise cancellation module 152 (e.g., to toggle the noise cancellation from an airplane mode to a movie theater mode, etc.).

The noise cancellation module 152 may be configured to allow particular types of ambient audio. For example, the noise cancellation module 152 may be pre-configured to not cancel public announcements (e.g., evacuation orders, fire alarms, etc.). In some embodiments, the system 100 may be configured to interrupt and/or override the selected audio track to enable playback of a public announcement.

In some embodiments, the headphones 120 may be implemented as a headset incorporated with glasses/video screens (e.g., for viewing 3D movies). The glasses portion of the headphones 120 may comprise cameras configured to monitor the gaze direction of the user. The noise cancellation module 152 may be configured to adjust the audio generated based on where the user is looking (e.g., enhance the audio of the actor the user is looking at on the screen 54). In another example, different audio may be played based on where the user is looking (e.g., play the guitar audio and muffle the bass if the user is looking at a guitarist at a concert).

Figure 4:
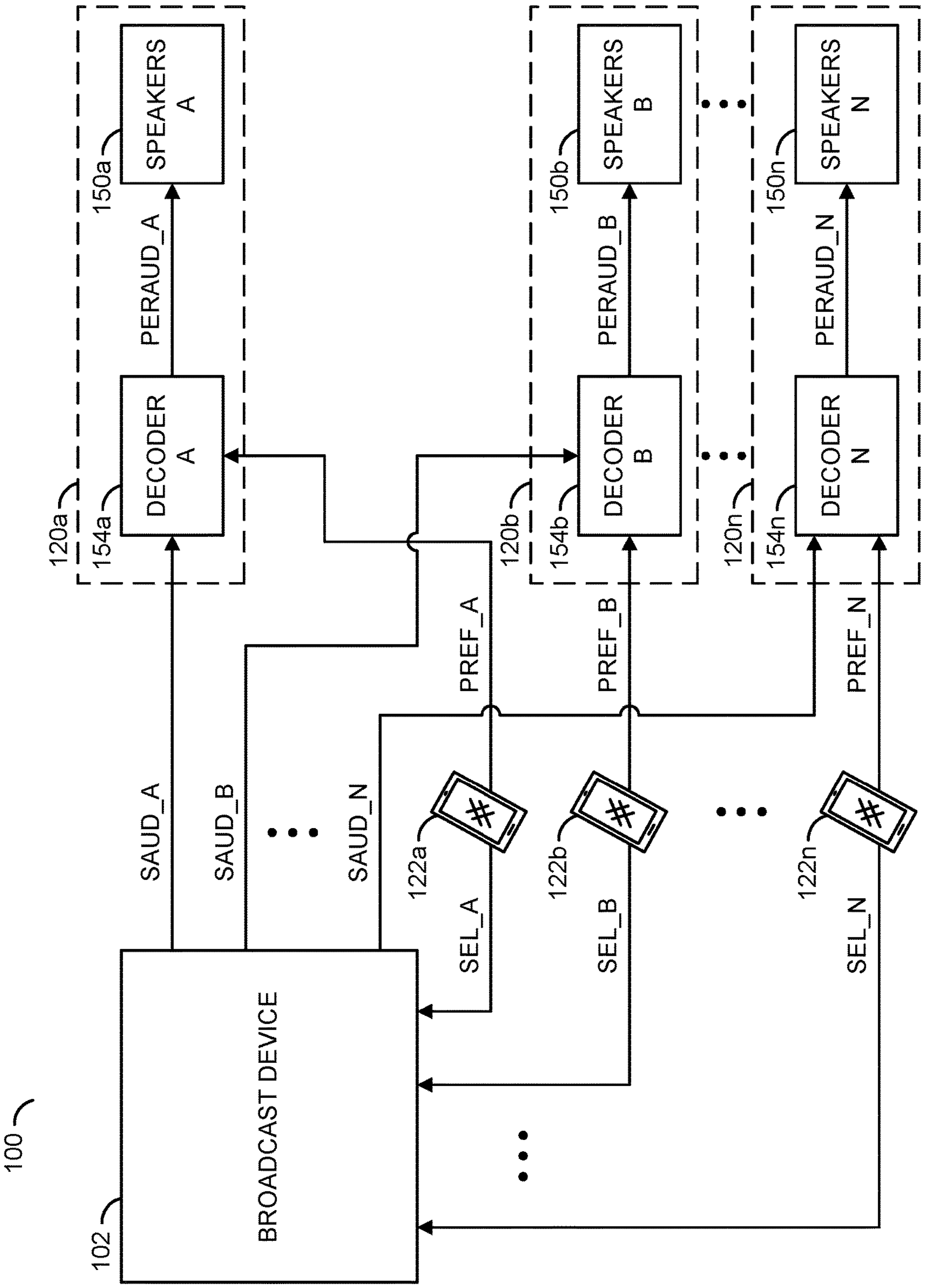
FIG. 4 is a block diagram illustrating generating multiple personalized audio signals for attendees of a venue.

Referring to FIG. 4, a block diagram illustrating the system 100 generating multiple personalized audio signals for attendees of the venue 50 is shown. The system 100 may be configured to provide personalized audio for multiple users in the venue 50. A portion of the system 100 is shown. The portion of the system 100 shown may comprise the broadcast device 102, the smartphones 122*a*-122*n* and/or the headphones 120*a*-120*n* (e.g., the corresponding decoders 154*a*-154*n* and the speakers 150*a*-150*n* of the headphones 120*a*-120*n* are shown). In the example shown, the smartphones 122a-122n may be used as a representative example of user input using the user interface 130 (e.g., alternately, the interface 130' on the seat 124 and/or the interface 130" on the headphones 120a-120n may be used to receive the user input). In the example shown, the decoders 154a-154n and/or the speakers 150a-150n may be implemented by the headphones 120a-120n. In another example, one or more of the decoders 154a-154n may be implemented by the venue 50 (e.g., the decoder 154i may be implemented as part of the broadcast device 102 and/or the speaker 150i may be one of the speakers 52a-52n shown in association with FIG. 1). The implementation and/or arrangement of the components of the system 100 may be varied according to the design criteria of a particular implementation.

The smartphones 122a-122n are each shown presenting a signal (e.g., SEL_A-SEL_N) and/or a signal (e.g., PREF_A-PREF_N). The signals SEL_A-SEL_N may be a selection input for the broadcast device 102. The signals PREF_A-PREF_N may be preference information presented to the respective decoders 154a-154n.

The selection signals SEL_A-SEL_N may be presented to the broadcast device 102 (e.g., to the storage module 104 via the I/O interface 116) to select one or more of the audio tracks 112a-112n. For example, the users may each use the interface 130 provided by the smartphones 122a-122n to select the audio tracks 112a-112n (e.g., select a language for a movie, select an instrument or a group of instruments for a live audio performance, select an audio feed from a performer for a stage play, etc.). The processor 138a of the smartphones 122a-122n may each generate one of the signals SEL_A-SEL_N to provide the selection of the user to the broadcast device 102. The broadcast device 102 may generate the selected audio tracks 112a-112n in response to the signals SEL_A-SEL_N.

The broadcast device 102 is shown generating the signals SAUD_A-SAUD_B. The signals SAUD_A-SAUD_N may be the selected audio. The selected audio may be one or more of the audio tracks 112a-112n. The signals SAUD_A-SAUD_N may be generated in response to the selection signals SEL_A-SEL_N. For example, the processor 114 may receive and interpret the signals SEL_A-SEL_N and select the appropriate audio tracks 112a-112n. The selected audio signals SAUD_A-SAUD_N may be presented to the headphones 150a-150n corresponding to the user of the smartphones 122a-122n that provided the selection signals SEL_A-SEL_N.

In some embodiments, the selected audio SAUD_A-SAUD_N may comprise one of the audio tracks 112a-112n. For example, the user may select one language audio track for viewing a movie. In some embodiments, the selected audio SAUD_A-SAUD_N may comprise more than one of the audio tracks 112a-112n (e.g., the user may select multiple audio feeds for a live concert). In an example, the user may be at a heavy metal concert and want to hear the guitars, bass, keyboard and drums, but does not like the vocals. The user may use the interface 130 to select the audio tracks (e.g., 112a-112e corresponding to lead and rhythm guitars, bass guitar, drums and keyboards) but not select the audio track (e.g., 112f corresponding to the vocals) and the smartphone 122 may provide the selections via the selection signal (e.g., SEL_A). The broadcast device 102 may select the audio tracks 112a-112e but not the audio track 112f as the selected audio signal (e.g., SAUD_A) to effectively provide an instrumental version of the live music concert.

The users may change the selected audio SAUD_A-SAUD_N in real-time. For example, the user may initially select the audio tracks to listen to the live concert (e.g., 112a-112f corresponding to lead and rhythm guitars, bass guitar, drums, keyboards and vocals). The user may then change the selection at any time. For example, the user may want to focus on the lead guitar during a guitar solo, so the user may send the selection signal (e.g., SEL_B) to select the audio track 112a and de-select the audio tracks 112b-112f. Since the signal SAUD_B was already presenting the selected audio track 112a, the broadcast device 102 may continue presenting the selected audio track 112a in the signal SAUD_B and remove the audio tracks 112b-112f. In another example, the user may have options to enhance one of the audio tracks (e.g., the volume level for the lead guitar audio track 112a may be increased) while still receiving the other selected audio tracks 112b-112f (e.g., presented at the previous volume level) to effectively enable the user to re-mix the audio in real-time.

The decoders 154a-154n may be configured to decode the selected audio tracks SAUD_A-SAUD_N. Decoding the audio tracks SAUD_A-SAUD_N may generate analog audio that may be heard by the users via the speakers 150a-150n. The decoders 154a-154n may be further configured to adjust the selected audio tracks SAUD_A-SAUD_N based on the preferences provided by the users. The processor 162 of the headphones 120a-120n may receive and interpret the preferences in response to the signals PREF_A-PREF_N from the smartphones 122a-122n. The decoders 154a-154n may adjust the selected audio SAUD_A-SAUD_N in response to the preferences PREF_A-PREF_N.

The signals PREF_A-PREF_N may comprise preference information from the users. In an example, the smartphones 122a-122n may generate the preference information in response to the users selecting options using the interface 130. The preferences may comprise modifications and/or adjustments that may be made to the selected audio tracks SAUD_A-SAUD_N. The preferences may comprise volume, maximum volume, audio normalization, equalization settings, profanity filtering, etc. The types of preferences that may be set may be varied according to the design criteria of a particular implementation.

The decoders 154a-154n may be configured to generate signals (e.g., PERAUD_A-PERAUD_N). The signals PERAUD_A-PERAUD_N may be presented to the speakers 150a-150n. The signals PERAUD_A-PERAUD_N may be the personalized audio for each user. The signals PERAUD_A-PERAUD_N may be generated in response to the selected audio signals SAUD_A-SAUD_N and the preference information PREF_A-PREF_N. For example, the decoders 154a-154n may adjust/modify the selected audio SAUD_A-SAUD_N using the preference information PREF_A-PREF_N to generate the personalized audio PERAUD_A-PERAUD_N.

The personalized audio PERAUD_A-PERAUD_N may also undergo noise cancellation before being communicated to the speakers 150a-150n. The noise cancellation modules 152a-152n (not shown) may perform the noise cancellation on the personalized audio PERAUD_A-PERAUD_N.

The personalized audio PERAUD_A_PERAUD_N may be generated for each user in the venue 50 (e.g., each user using the headphones 120). The personalized audio PERAUD_A-PERAUD_N may be an individualized audio experience generated based on the input to the system 100 provided by the user. Each user may receive an individual personalized audio track (e.g., other users may not hear the personalized audio selected by another user). The personalized audio signals PERAUD_A-PERAUD_N may not necessarily be unique (e.g., if two users select the exact same audio track(s) and settings, the personalized audio may be the same). The personalized audio PERAUD_A-PERAUD_N may provide the capability of providing a unique audio stream to each user.

Figure 5:
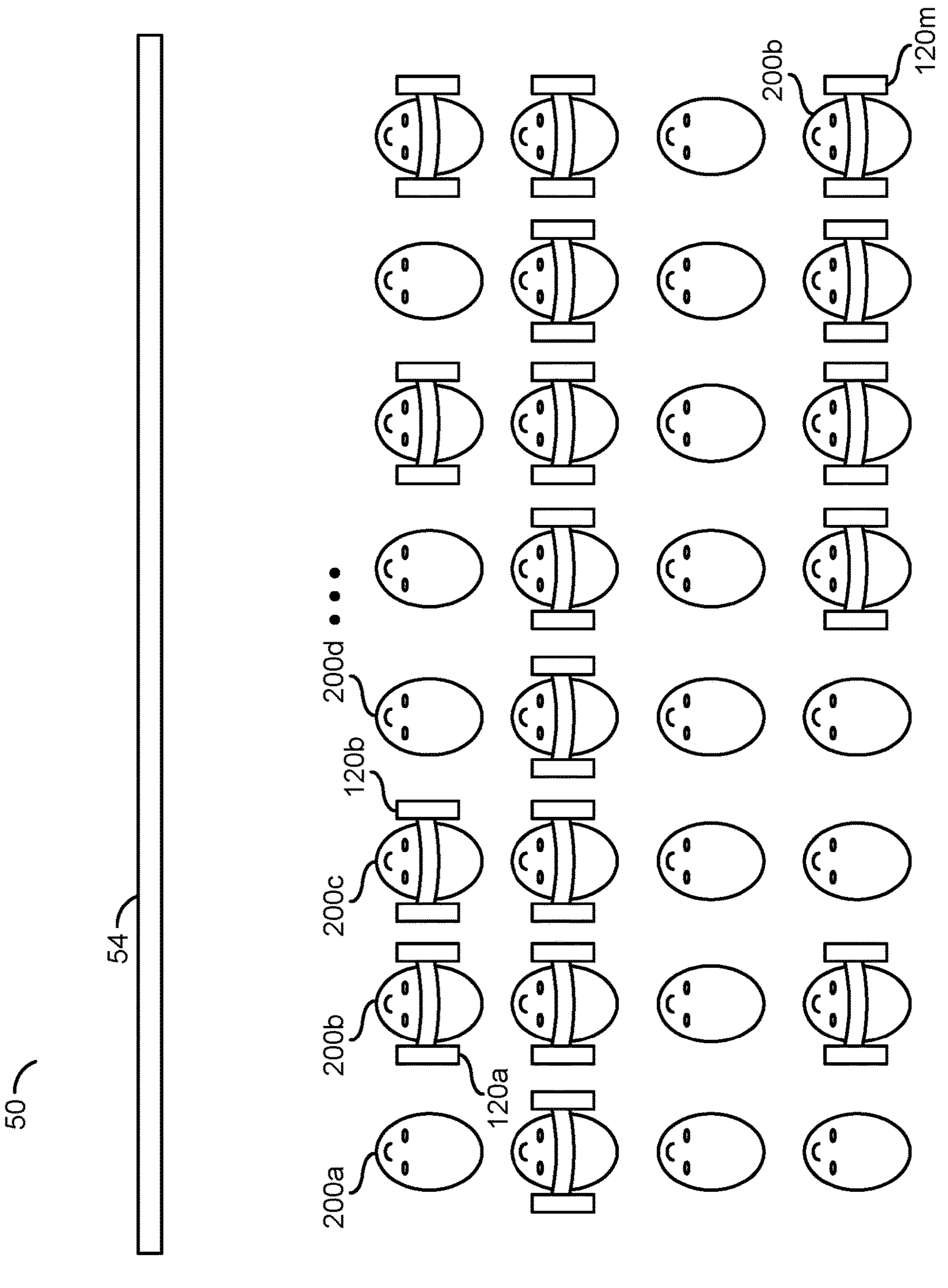
FIG. 5 is a diagram illustrating attendees at a venue.

Referring to FIG. 5, a diagram illustrating attendees at the venue 50 is shown. The example of the venue 50 may be an overhead view of a movie theater. Users (or attendees) 200*a*-200*n* are shown. The attendees 200*a*-200*n* may be in a row seating arrangement facing the movie screen 54.

The headphones 120*a*-120*m* are shown being worn by some of the attendees 200*a*-200*n*. Wearing one of the headphones 120*a*-120*m* may be a decision made by each of the attendees 200*a*-200*n*. In the example shown, the attendee 200*a* and the attendee 200*d* are not wearing one of the headphones 120*a*-120*m*, the attendee 200*b* is wearing the headphones 120*a* and the attendee 200*c* is wearing the headphones 120*b*. For example, some of the attendees 200*a*-200*n* may prefer hearing the audio from the speaker system 52*a*-52*h* of the venue 50. The speaker system 52*a*-52*h* may not provide the attendees 200*a*-200*n* a choice of the audio tracks 112*a*-112*n* (e.g., the speaker system 52*a*-52*n* may playback a default audio track).

In one example, the headphones 120*a*-120*m* may be portable. For example, the headphones 120*a*-120*m* may be brought to any seat location by the attendees 200*a*-200*n*. In another example, the headphones 120*a*-120*m* may each be assigned to a particular seat (e.g., a wired connection). Generally, whether the headphones 120*a*-120*m* use a wired or wireless connection, each seat location may have access to one of the headphones 120*a*-120*m* (e.g., the headphones 120*a*-120*m* may not be limited to specific seat locations in the venue 50).

Figure 6:
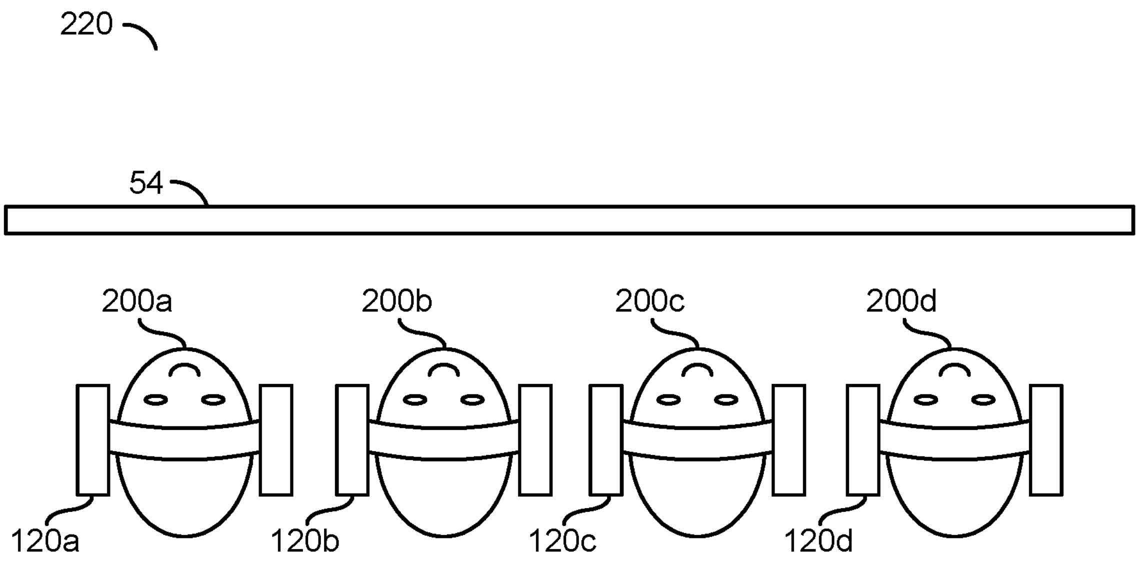
FIG. 6 is a diagram illustrating detecting motion of a headset.
Figure 6:
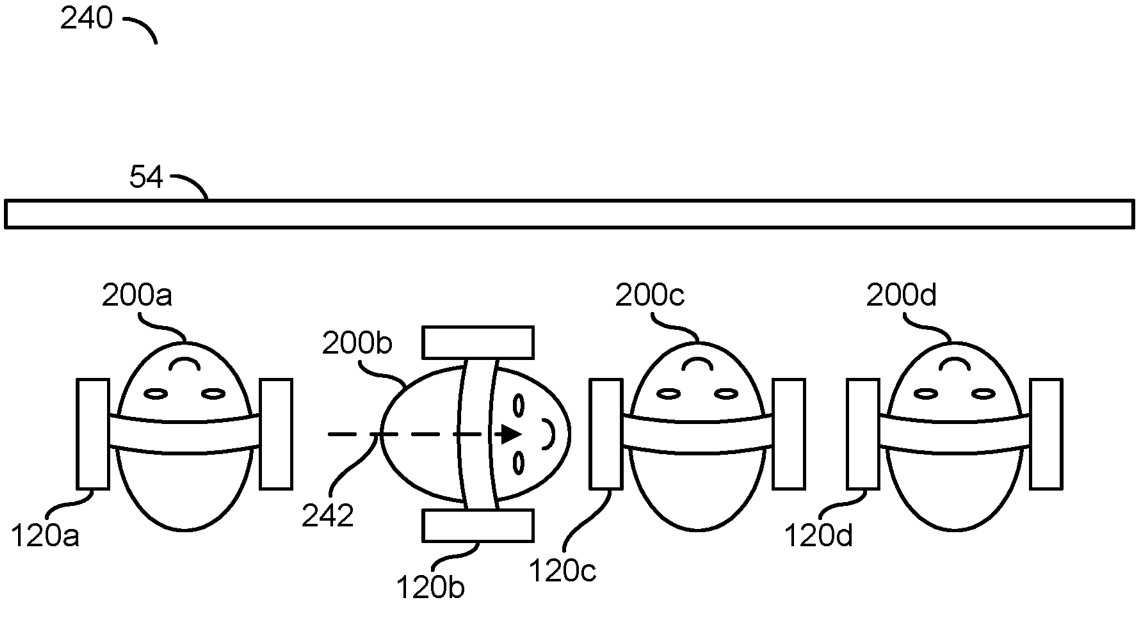

Referring to FIG. 6, a diagram illustrating detecting motion of a headset is shown. A scenario 220 and a scenario 240 are shown. The scenario 220 may show an example arrangement of attendees 200*a*-200*d* wearing the headsets 120*a*-120*d* at a first time. The scenario 240 may show an example arrangement of the attendees 200*a*-200*d* wearing the headsets 120*a*-120*d* at a second time.

In the scenario 220, each of the attendees 200*a*-200*d* are shown facing the screen 54. Facing the screen 54 (or a stage for a live venue or a playing surface for a sports venue) may be considered a default orientation. For example, most attendees 200*a*-200*n* at a movie theater will be facing the screen for the majority of the movie. The motion sensing module 156 of each of the headsets 120*a*-120*n* may determine the orientation of the respective headsets 120*a*-120*n*. Generally, when the headsets 120*a*-120*n* are in the default orientation, the audio decoders 154 may playback the selected tracks 112*a*-112*n*.

In one example, the default orientation may be determined by the motion sensing module 156 based on an amount of time the headsets 120*a*-120*n* are in a particular orientation. Since most of the attendees 200*a*-200*n* may be facing the screen 54 during a movie, the motion sensing module 156 may make an assumption that the default orientation is an orientation that the attendees 200*a*-200*n* spend most of the time facing. In another example, the default orientation may be determined by the motion sensing module 156 based on a proximity to an external sensor (e.g., located in the seat 124, located at the screen 54, etc.) and/or a calibration process (e.g., look at the screen 54 and press a button, look to the right/left and press a button, etc.). The motion sensing module 156 may compare the orientation of the headphones 120*a*-120*n* with the external proximity module to determine the default orientation. In yet another example, the communication modules 158 may communicate the orientation information detected by each of the motion sensing modules 156 of the headphones 120*a*-120*n* to determine a most common orientation. While a few of the attendees 200*a*-200*n* may not be facing the screen 54 at a particular time, most of the attendees 200*a*-200*n* will likely be facing the screen 54. The method of determining the default orientation may be varied according to the design criteria of a particular implementation.

In the scenario 240, each of the attendees 200*a*, 200*c* and 200*d* are shown facing the screen 54 and the attendee 200*b* is shown facing the attendee 200*c*. For example, the attendee 200*b* may have turned in order to speak to the attendee 200*c*. The noise cancellation and/or the orientation detection implemented by the headphones 120*a*-120*n* may enable the attendee 200*b* to speak to the attendee 200*c* without affecting the audio experience of the attendee 200*a* or 200*d*.

The motion sensing module 156 may detect a change in the orientation of the headset 120*b*. A dotted line 242 is shown. The dotted line 242 may represent the detection of the change in direction of the headset 120*b* to the right. In an example, the motion sensing module 156 may detect that the headset 120*b* has changed to the right with respect to the default orientation. The change in orientation to the right 242 may be detected and the processor 162 may enable communication using the microphone 160. The attendee 200*b* may speak into the microphone 160 of the headphones 120*b* in order to communicate with the attendee 200*c* (and/or the user 200*d*). In one example, the wireless communication module 158 may transmit the received speech audio from the microphone 160 of the headset 120*b* to the headset 120*c*. In another example, the microphone 160 of the headset 120*c* may be used as the microphone to receive the speech audio. The speakers 150 of the headset 120*c* may playback the received speech audio.

Figure 7:
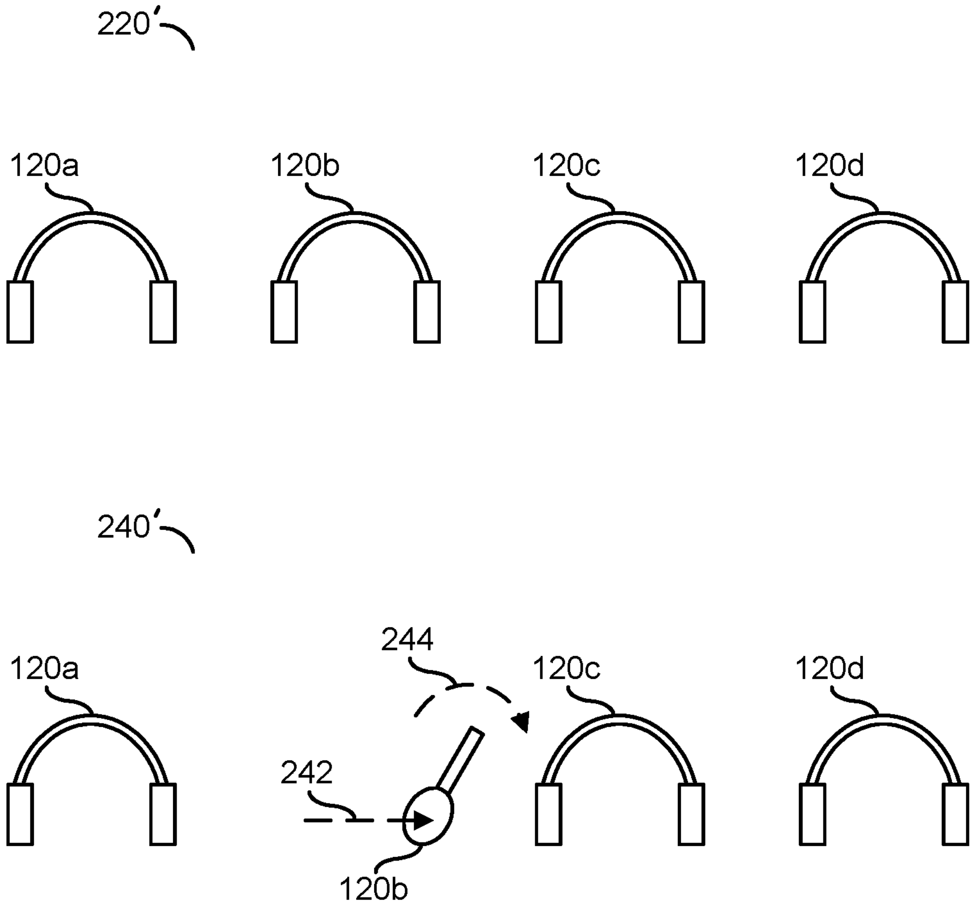
FIG. 7 is a diagram illustrating an alternate example of detecting motion of a headset.

Referring to FIG. 7, a diagram illustrating an alternate example of detecting motion of a headset is shown. The scenario 220' and the scenario 240' are shown. The scenario 220' and the scenario 240' may correspond with the scenario 220 and the scenario 240, respectively. The scenario 220' and the scenario 240' may provide a rear view of the headsets 120*a*-120*d* (e.g., the heads of the attendees 200*a*-200*d* are not shown for simplicity).

In the scenario 220', the headsets 120*a*-120*d* are shown in the default orientation (e.g., forward facing the screen 54, which is not shown). In some embodiments, the headsets 120*a*-120*d* may be configured to receive the transmitted speech audio (e.g., an audio message) from the microphone 160 of the attendees 200*a*-200*d* that are speaking via the wireless communication module 158 (or via a wired signal). In some embodiments, the headsets 120*a*-120*d* may be configured to receive the audio message by capturing the audio of a nearby user using the microphone 160 and providing the captured audio to the speakers 150. However, playing back the received speech audio message may interfere with the playback of the selected audio tracks 112*a*-112*n*. In order to prevent playing undesired speech (e.g., from an unknown attendee), the interface 130 may enable the attendees 200*a*-200*n* to approve particular attendees that are able to communicate. For example, a group of friends going to a movie together may all approve each other. Speech audio message communicated by an attendee that is not approved may not be played back by the speakers 150. Speech audio message communicated by an attendee that has been approved may be played back by the speakers 150. For example, the processor 162 may compare a source of the audio message (e.g., an ID of the headsets 120*a*-120*n*) to a list of approved sources stored by the memory 164 (e.g., the user preferences stored in the memory 136*b* of the remote device 134 may provide a list of approved audio sources for the user to the headsets 120*a*-120*n*).

In some embodiments, the attendee that wants to communicate with another one of the attendees 200*a*-200*n* may select one or more intended targets. For example, the attendees 200*b*-200*d* may each approve each other for communication. However, for a particular conversation, the attendee 200*b* may only want to communicate with the attendee 200*d* instead of both the attendees 200*c*-200*d*. The interface 130 may provide options for selecting which of the approved attendees to communicate with. In one example, the attendee 200*b* may speak first, then select the intended targets using the interface 130. In another example, the attendee 200*b* may select the intended targets using the interface 130 and then speak into the microphone 160.

In some embodiments, the audio message received by the microphone 160 may be provided to each of the headsets 120*a*-120*m* but not played back using the speakers 150 unless the attendee has been approved. The received audio message may be analyzed using the noise cancellation module 152 to cancel the noise created by the attendee that is speaking.

In one example, a group of the attendees (e.g., the attendees 200*a*-200*d* may be a group of friends attending a movie together) may all select each other as a group to have all members of the group hear everything spoken by each member of the group. Regardless of which direction the speaking user turns (e.g., whether the direction 242 is to the left or the right) every member of the group may receive the spoken audio. For example, the attendee 200*b* may turn to the left or the right to speak and each of the other members of the group (e.g., the attendee 200*a* and the attendees 200*c*-200*d*) may receive the audio message by the attendee 200*b*, while other attendees (e.g., 200*e*-200*n*) may not hear what was spoken by the attendee 200*b*.

In the scenario 240', the changed orientation to the right 242 for the headset 120*b* is shown. An arrow 244 is shown. The arrow 244 may represent a change in proximity between the headset 120*b* and the headset 120*c*. In some embodiment, the headsets 120*a*-120*m* may each comprise a proximity sensor as part of the motion sensing module 154. The proximity change 244 may be detected to indicate that one attendee is attempting to speak to another. Generally, movie attendees lean towards each other when speaking. The motion sensing module 154 may detect the change in proximity to determine the intended target of the communication.

In the example shown, the headset 120*b* may be worn by the communicating user. The proximity change 244 may indicate that the headset 120*b* has moved closer to the headset 120*c*. The change in proximity with respect to the headset 120*c* may indicate that the attendee 200*c* is the target of the communication.

In some embodiments, the headsets 120*a*-120*m* may receive the speech audio message from an attendee that has been approved and the recipient headset may temporarily store the received speech audio in the memory 164. For example, the recipient headset 120*c* may provide the attendee 200*c* with a notification (e.g., on the interface 130 and/or using the notification light 166) to indicate that audio communication from the attendee 200*b* wearing the headset 120*b* has been received. The recipient headset 120*c* may delay playing back the audio message from the speakers 150 until the attendee 200*c* uses the interface 130 to playback the received audio message. For example, the attendee 200*c* may want to hear the spoken audio message communication from the attendee 200*b*, but does not want to miss the selected audio 112*a*-112*n* for a particular part of the movie. Delaying the playback of the speech audio message may enable the recipient headset 120*c* to play back the audio message at a time that is convenient for the attendee 200*c* (e.g., after the particular scene has finished, during a quiet part of the movie, etc.).

The headset 120*c* of the recipient attendee 200*c* may display a notification (e.g., the LED 166 may blink or turn a particular color, the interface 130" may display a message, etc.) to indicate that the playback of the speech audio message has been delayed in order to indicate to the communicating attendee 200*b* that the speech audio message has not yet been heard. After the recipient attendee 200*c* listens to the stored speech audio, the notification may change (e.g., the LED 166 may turn off, the color of the LED 166 may change, a message may disappear, etc.). Changing the notification may indicate to the communicating attendee 200*b* that the recipient attendee 200*c* has heard the spoken audio message (e.g., the communicating attendee 200*b* would already have turned to face the recipient attendee 200*c* to enable communication and would be able to see the visual cue).

In some embodiments, the speech communication may not be sent using the microphone 160. In one example, the motion sensing module 156 of the headset 120*b* may sense the change in position 242 being turned laterally from the screen 54 to face the neighboring attendee 200*c*. The addition of the proximity sensor to the motion sensing module 156 may enable monitoring of whether the headset 120*b* is getting closer to the neighboring headset 120*c*. The detection of the movement 242 and/or the proximity change 244 may indicate that the user is trying to communicate with the neighbor. Since each of the headsets 120*a*-120*n* have the noise cancellation module 152, any words or utterances from the user 200*b* may be muted by the system 100 by default. The movement 242 could send a signal to the neighboring headset 120*c* to unmute and/or amplify external voice frequencies by the noise cancellation module 152 and allow the utterance of the user 200*b* to be heard. The incoming digital audio from the selected audio tracks 112*a*-112*n* could be muffled or muted temporarily.

In another example, the headsets 120*a*-120*m* may be configured to use the motion sensing module 156 to sense that the position has moved from parallel to the screen (e.g., user gaze has moved away from the movie screen 54) to slightly downward (e.g., towards the lap). A change of orientation towards the lap may be an indication that the attention of the user has changed to the smartphone 122 (or something else). The enable the user to focus on the smartphone 122 (or another object), the system 100 may temporarily muffle or mute the selected audio tracks 112*a*-112*n* to allow the user to better concentrate on an alternate task. The system 100 may be configured to work in conjunction with the sensor suite of the smartphone 122. The sensor suite on the smartphone 122 (e.g., determined using the processor 138*a*) may indicate that the user is moving the smartphone 122 and/or viewing the smartphone 122. When the sensor suite of the smartphone 122 detects the user interaction, the smartphone 122 may send a signal to the headset 120 and the processor 162 may mute or muffle the selected audio tracks 112*a*-112 and/or override with audio from another subsystem of the smartphone 122 (e.g., to listen to an incoming voicemail, to listen to a text-to-speech playback of a text message, etc.).

In some embodiments, the noise cancellation module 152 may be tuned for the pre-selected group of the attendees

200*a*-200*m*. For example, the attendees 200*a*-200*d* may form a group that is pre-approved for allowing speech communication. The noise cancellation modules 152 of the headphones 120*a*-120*c* may be configured to allow the unique voice frequency of the attendees 200*a*-200*d* to bypass the noise cancellation. In an example, the noise cancellation modules 152 may be pre-tuned by each of the users 200*a*-200*d* in the group speaking into the microphone 160 to provide sample speech. Pre-tuning the noise cancellation may enable each of the attendees 200*a*-200*d* in the pre-approved group to speak to one another without having to turn to the side to change the direction 242 or lean closer to provide the change in proximity 244. In another example, the microphone 160 may comprise a temperature and/or humidity sensor configured to detect a change in temperature and/or moisture caused by the breath of the attendees 200*a*-200*d* speaking. The detection of the breath may be used to determine when the attendees 200*a*-200*d* are speaking.

Figure 8:
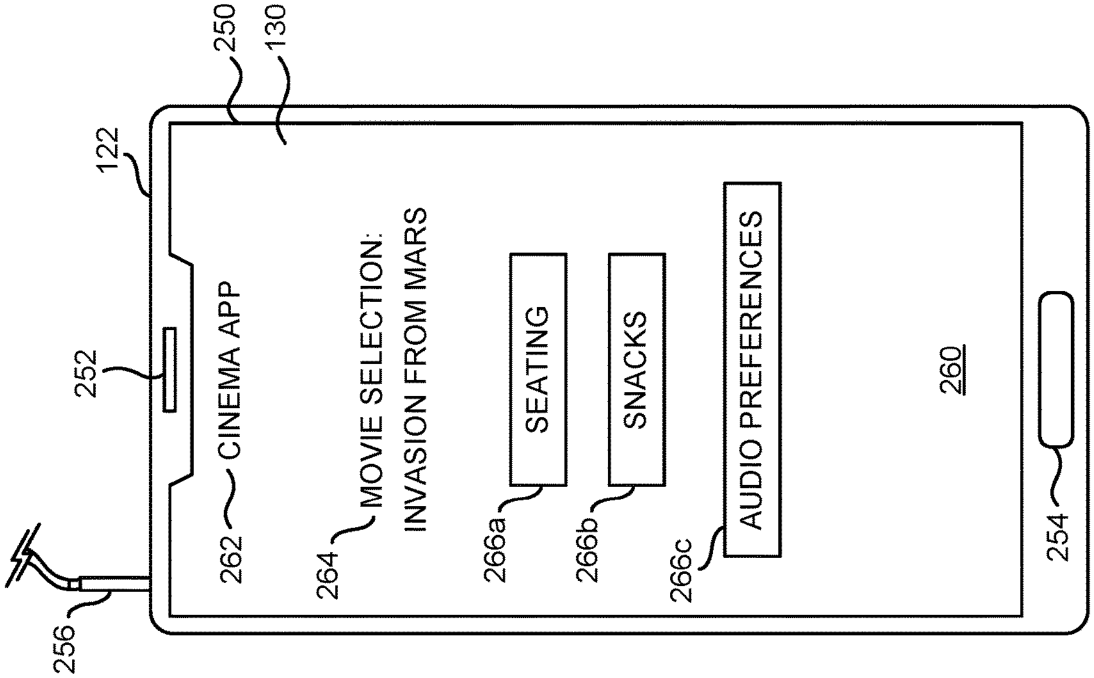
FIG. 8 is a diagram illustrating an example interface for a smartphone.

Referring to FIG. 8, a diagram illustrating an example interface for the smartphone 122 is shown. The smartphone 122 is shown. The smartphone 122 is shown comprising a display 250, a speaker 252 and/or a microphone 254. The display 250 may be configured to output the interface 130. The display 250 may be a touchscreen interface capable of displaying an output and receiving input (e.g., touch-based input). The speaker 252 may generate audio. The microphone 254 may receive audio. In some embodiments, if the headphones 120 do not implement the microphone 160, the microphone 254 of the smartphone 122 may be used for receiving spoken audio messages.

A cable 256 is shown attached to the smartphone 122. In some embodiments, the headset 120 may have a wired connection to the smartphone 122 using the cable 256. For example, the selected digital audio may be provided by the theater sound distribution system 102 via wireless technology to the smartphone 122. Then audio may be presented to the headset 120 via the wired connection 256 to the headset 120. Both the controls and the audio signals may be sent by the smartphone 122 via the wired connection 256. The wired connection 256 may mute the speaker 252 (e.g., to prevent audio such as phone calls or app alerts generated by the smartphone 122 from disturbing the attendees 200*a*-200*n*).

The cable 256 may be optional. In one example, the digital audio may be incoming to the headset 120 directly from the theater sound distribution system 102 (e.g., communicated wirelessly). In another example, the digital audio may be first transmitted to the smartphone 122 and then to the headset 120.

A companion app 260 is shown. The companion app 260 may be part of the interface 130. The app 260 may be configured to provide the interface 130 to enable the user to have personalized control for the system 100. In an example, the smartphone app 260 may comprise a number of menus. The smartphone app 260 may be implemented having a "night mode" so that when the display 250 outputs the smartphone app 260, the output may not be obtrusive to other patrons (e.g., a dim screen brightness may be used to prevent 'light pollution' caused by a glowing screen in a dark environment).

The companion app 260 may be integrated with the application (e.g., connect to an API for a backend) each theater uses to show listing times, sell tickets, allow users to pre-select seating, pre-order snacks, etc. The app 260 may comprise a set of preferences that are selected by the user specific to each viewing and/or preferences built up over time. The app 260 may communicate with the remote server 134 to retrieve and/or update the user preferences. In an example, after attending several movies a particular user may always muffle gun and cannon blasts. The preference for the user to muffle the gun and cannon blasts may be stored by the memory 136*b* of the remote device 134 for future viewings and/or learned over time using the processor 136*a* of the remote device 134 to predict which types of sounds the user would prefer to muffle. The preferences of each user may be stored on the remote server 134 (e.g., a distributed storage and/or cloud storage). In one example, each user may have an account registered (e.g., stored in the memory 136*b*) for the movie theaters that may store the preferences.

In the example shown, a main menu for the app 260 may be output by the display 250. Generally, when the app 260 is running, the speaker 252 may be disabled (e.g., as a courtesy to other attendees to prevent undesired audio interruptions such as ringtones). The main menu for the app 260 may comprise a title 262. In some embodiments, each theater may have a customized version of the app 260 with specific branding.

The main menu for the app 260 may comprise buttons (e.g., software buttons) 266*a*-266*c*. Selecting one of the buttons 266*a*-266*c* may activate a sub-menu for the app 260. The button 266*a* may provide seating options and/or ticket purchasing. The button 266*b* may provide a checkout for pre-ordering concessions and/or having concessions delivered to the seat 124 (e.g., popcorn, drinks, candy, etc.). The button 266*c* may provide the audio preferences (e.g., for personalizing the audio tracks). The app 260 may provide other options (not shown). The number and/or types of features implemented by the app 260 may be varied according to the design criteria of a particular implementation.

Figure 9:
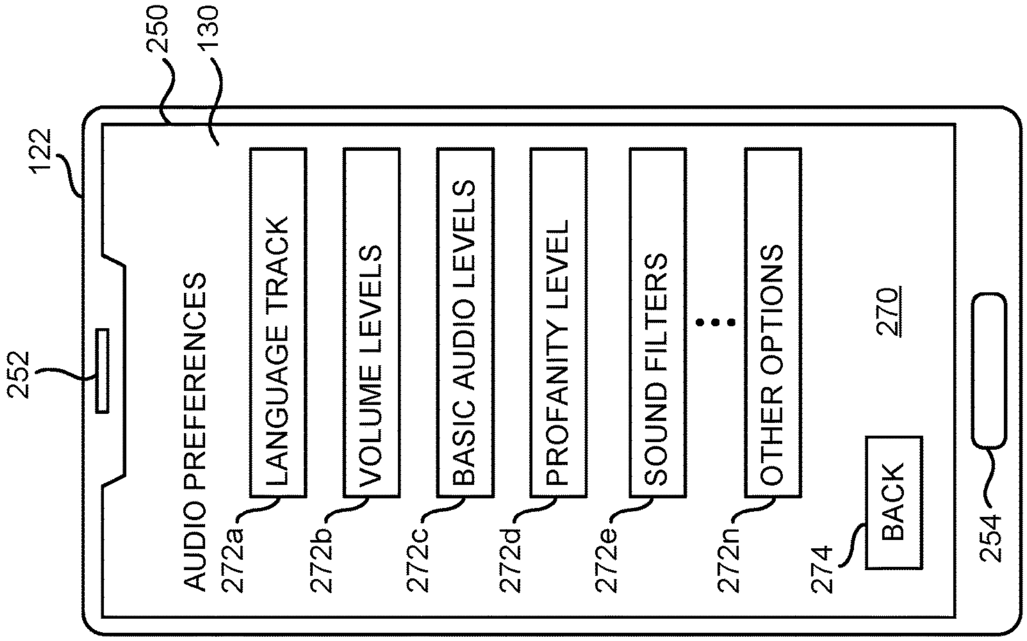
FIG. 9 is a diagram illustrating an example interface for audio preferences.

Referring to FIG. 9, a diagram illustrating an example interface for audio preferences is shown. The smartphone 122 is shown. The touchscreen display 250, the speaker 252 and the microphone 254 of the smartphone 122 are shown. The display 250 is shown presenting the interface 130. In the example shown, the interface 130 may provide an audio preferences interface 270 of the app 260.

The audio preferences interface 270 may comprise a number of sub-menu options 272*a*-272*n* and a back button 274. The sub-menu options 272*a*-272*n* may be software buttons that cause the app 260 to open a sub-menu corresponding to a particular feature. The back button 274 may be a software button for returning to a previous screen (e.g., the main menu of the app 260). The sub-menu options 272*a*-272*n* may be configured to allow the user to adjust various settings such as volume, language track, bass, treble, maximum volume, minimum volume, etc. The number and/or types of features provided by the sub-menu options 272*a*-272*n* may be varied according to the design criteria of a particular implementation.

In the example shown, the sub-menu option 272*a* may enable an adjustment of the language track, the sub-menu option 272*b* may enable an adjustment of volume levels, the sub-menu option 272*c* may enable an adjustment of basic audio levels, the sub-menu option 272*d* may enable an adjustment of profanity levels and the sub-menu option 272*e* may enable an adjustment of sound filters. For example, the sound filters may enable the user to select a number of obtrusive and/or offensive sounds to be muted or muffled with a sliding scale (e.g., such as profanity, animal sounds, monster sounds, gun shots, back fires, canon blasts, crying, screaming, sounds of pain or anguish, etc.). Details of the features/preferences that may be adjusted in the sub-menus 272a-272n may be described in more detail in association with FIGS. 10-14.

Figure 10:
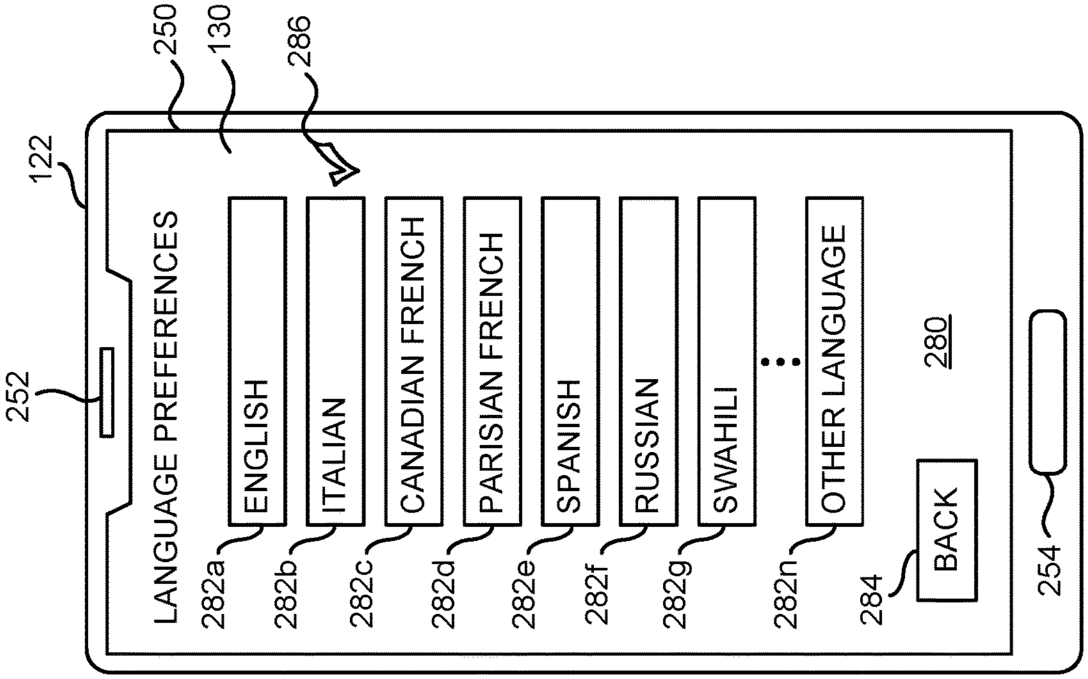
FIG. 10 is a diagram illustrating an example interface for language preferences.

Referring to FIG. 10, a diagram illustrating an example interface for language preferences is shown. The smartphone 122 is shown. The touchscreen display 250, the speaker 252 and the microphone 254 of the smartphone 122 are shown. The display 250 is shown presenting the interface 130. In the example shown, the interface 130 may provide a language preferences interface 280 of the app 260.

The language preferences interface 280 may comprise a number of language options 282a-282n and a back button 284. The language options 282a-282n may comprise software buttons that enable selecting one of the audio tracks 112a-112n. The back button 284 may be a software button for returning to the audio preferences interface 270.

In the example shown, the language option 282a may be used to select the English audio track, the language option 282b may be used to select the Italian audio track, the language option 282c may be used to select the Canadian French audio track, the language option 282d may be used to select the Parisian French audio track, the language option 282e may be used to select the Spanish audio track, the language option 282f may be used to select the Russian audio track, the language option 282g may be used to select the Swahili audio track. Other languages may be available. The number and/or types of languages available may be varied according to the design criteria of a particular implementation.

A selection icon 286 is shown. In the example shown, the selection icon 286 may be a checkmark. The selection icon 286 may indicate a current selection for the audio tracks 112a-112n. In the example shown, the selection icon 286 may correspond to the Italian language option 282b. For example, when the Italian language option 282b is selected by the attendee 200a, the broadcast device 102 may provide one of the audio tracks 112a-112n that corresponds with the Italian language as the selected audio track SAUD_A to the decoder 154a. If the attendee 200a decides to select a different language (e.g., the Russian language option 282f), then the app 260 may generate the signal SEL_A to provide the selection of the Russian language to the broadcast device 102. The processor 114 of the broadcast device 102 may select the Russian language track from the audio tracks 112a-112n and present the Russian language track as the signal SAUD_A. The language preferences interface 280 may update to change the location of the selection icon 286 to correspond with the Russian language option 282f.

Similar to the language preferences interface 280, the app 260 may provide options for selecting various types of the audio tracks 112a-112n. For example, an interface similar to the language preferences interface 280 may be provided for selecting various instruments for a live music concert (e.g., the language options 282a-282n may be replaced with similar options for violins, trumpets, trombones, flutes, etc.). The language preferences interface 280 may be modified for the types of audio tracks 112a-112n for the particular event. In the example shown, the selection icon 286 may correspond to one of the language options 282a-282n. In some embodiments, the attendees 200a-200n may be able to select multiple options (e.g., the attendee may want to hear the woodwind instruments for an orchestral performance and may select multiple instruments such as flutes, clarinets, saxophone, etc.). The types of options for selecting the audio tracks 112a-112n may be varied according to the design criteria of a particular implementation.

Figure 11:
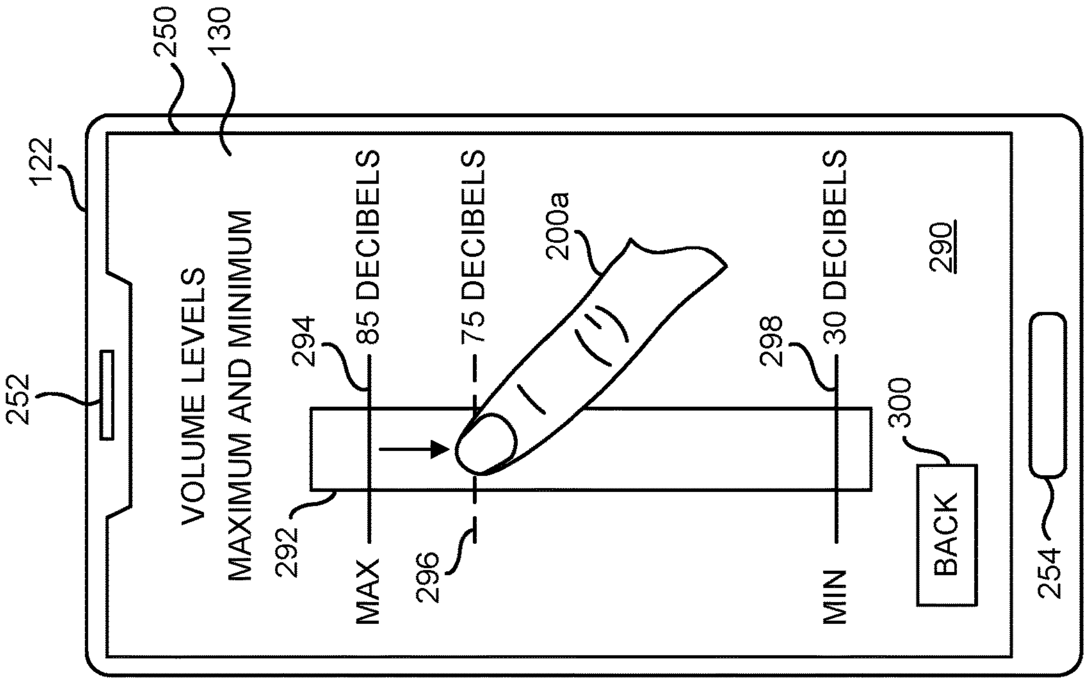
FIG. 11 is a diagram illustrating an example interface for volume level preferences.

Referring to FIG. 11, a diagram illustrating an example interface for volume level preferences is shown. The smartphone 122 is shown. The touchscreen display 250, the speaker 252 and the microphone 254 of the smartphone 122 are shown. The display 250 is shown presenting the interface 130. In the example shown, the interface 130 may provide a volume levels preferences interface 290 of the app 260.

The volume levels interface 290 may comprise a volume selection slider input 292. The volume selection slider 292 may enable the attendee 200a to provide a touch input for selecting a range of volumes for the selected audio track SAUD_A. The volume selection slider 292 may comprise a maximum value 294, a selected value 296 and a minimum value 298. The volume levels interface 290 may further comprise a back button 300 for returning to the audio preferences interface 270.

The attendees 200a-200n may select the maximum value 294 and the minimum value 298 for the selected audio tracks SAUD_A-SAUD_N. The decoders 154a-154n may be configured to normalize the audio based on the maximum value 294 and the minimum value 298. Selecting the maximum value 294 and the minimum value 298 may enable the attendees 200a-200n to personalize the audio output in order to prevent the audio from being too loud or too quiet. For example, setting the maximum value 294 may prevent a loud part of a movie (e.g., an explosion) from being uncomfortably loud and setting the minimum value 298 may prevent a quiet part of a movie (e.g., characters whispering to each other) from being difficult to hear.

In the example shown, the maximum value 294 may be at 85 dB and the minimum value 296 may be at 30 dB. The finger of the attendee 200a is shown sliding down the maximum value 294 to the selected value 296. In the example shown, the selected value 296 may be a value of 75 dB. When the attendee 200a selects the selected value 296, the app 260 may communicate the signal PREF_A to the decoder 154a. The signal PREF_A may provide information that comprises the new selected value 296. The decoder 154a may modify the selected audio signal SAUD_A to generate the signal PERAUD_A to provide the attendee 200a the personalized audio with the updated maximum volume level preference.

Figure 12:
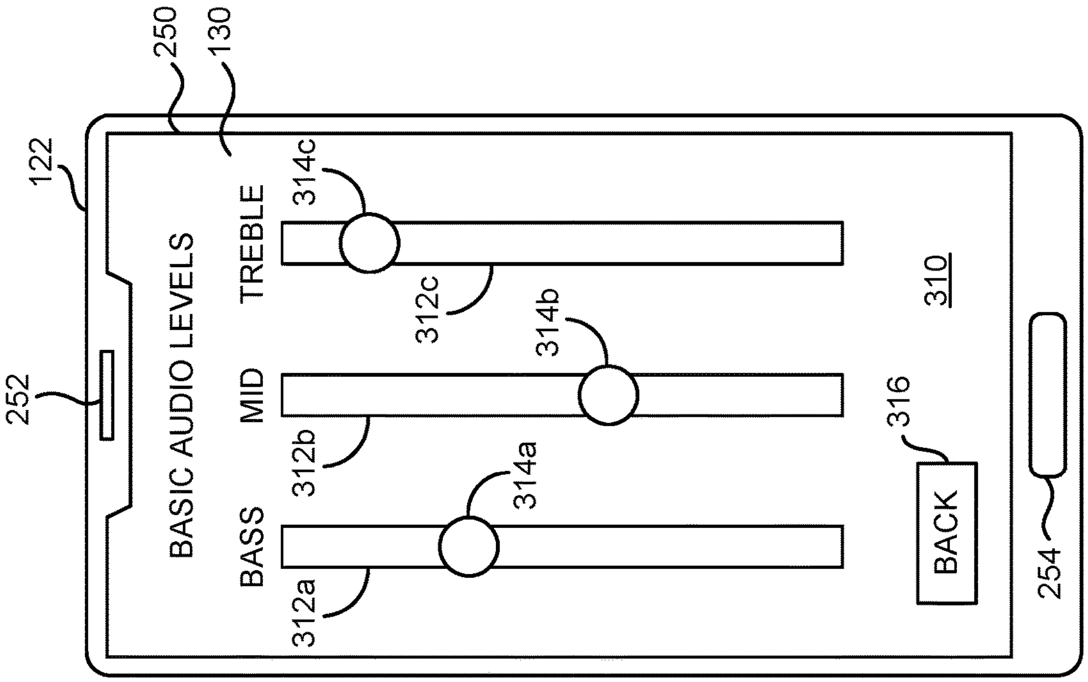
FIG. 12 is a diagram illustrating an example interface for audio level preferences.

Referring to FIG. 12, a diagram illustrating an example interface for audio level preferences is shown. The smartphone 122 is shown. The touchscreen display 250, the speaker 252 and the microphone 254 of the smartphone 122 are shown. The display 250 is shown presenting the interface 130. In the example shown, the interface 130 may provide a basic audio levels interface 310 of the app 260.

The basic audio levels interface 310 may comprise input sliders 312a-312c. The input sliders 312a-312c may enable the attendees 200a-200n to input preferences for audio equalization controls. In the example shown, the input slider 312a may correspond to bass, the input slider 312b may correspond to mid and the input slider 312c may correspond to treble. The basic audio levels interface 310 may further comprise the current selections 314a-314c and the back software button 316. The current selections 314a-314c may be used to select the preferences corresponding to the respective input sliders 312a-312c. The back button 316 may return the app 260 to the audio preferences interface 270.

In an example, when the attendee 200c moves the current selections 314a-314c, the smartphone 122c may generate the signal PREF_C comprising the updated user preferences for the basic audio levels. The signal PREF_C may be presented to the decoder 154c. The decoder 154c may interpret the user preferences of the signal PREF_C to modify the selected audio track from the signal SAUD_C. The user preferences may be applied by the decoder 154*c* to generate the personalized audio track PERAUD_C.

Figure 13:
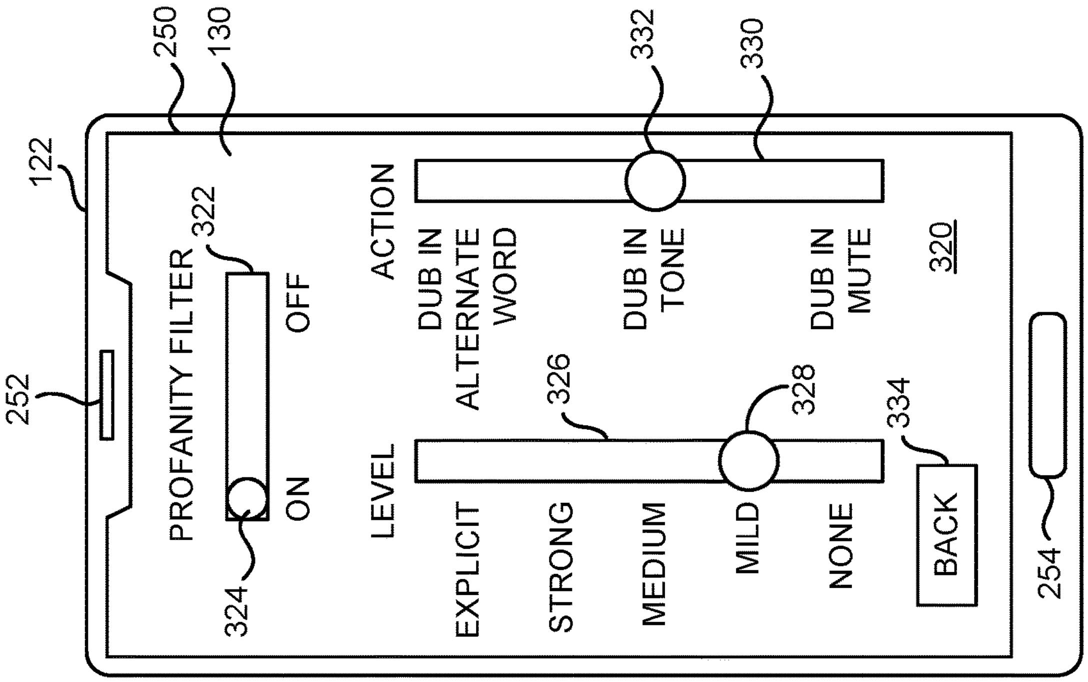
FIG. 13 is a diagram illustrating an example interface for profanity filter preferences.

Referring to FIG. 13, a diagram illustrating an example interface for profanity filter preferences is shown. The smartphone 122 is shown. The touchscreen display 250, the speaker 252 and the microphone 254 of the smartphone 122 are shown. The display 250 is shown presenting the interface 130. In the example shown, the interface 130 may provide a profanity filter interface 320 of the app 260.

The profanity filter interface 320 may comprise a toggle switch 322, a toggle selection 324, an input slider 326, a slider selection 328, an input slider 330, a slider selection 332 and/or a software back button 334. The toggle switch 322 may enable the attendees 200*a*-200*n* to toggle the profanity filter off or on (e.g., a master switch) using the toggle selection 324. The input slider 326 may enable the attendees 200*a*-200*n* to select a level of filtering using the slider selection 328. The input slider 330 may enable the attendees 200*a*-200*n* to select how the profanity is filtered using the slider selection 332. The back button 334 may return the app 260 to the audio preferences interface 270.

In the example shown, the profanity filter may be turned on. For example, when the profanity filter is turned off using the toggle selection 324, the profanity level 326 and the profanity filter action 330 may be unavailable (e.g., greyed out).

The profanity level slider 326 may comprise various levels (or amounts) of filtering. The levels of profanity filtering may determine which words are filtered out (e.g., violent language, swear words, sexually suggestive language, sexually explicit language, etc.). In one example, the levels of profanity filtering may be based on MPAA film ratings (e.g., G, PG, NC-17, etc.). In another example, the levels may comprise lists of words (e.g., user-editable or user-downloadable lists of words may be selected).

The profanity filter action slider 330 may comprise various options for handling the filtered words. In one example, the profanity may be replaced with no audio (e.g., dub in mute). In another example, the profanity may be replaced with a tone (e.g., a bleep sound such as, "I have had it with these mother[BLEEP] snakes on this mother[BLEEP] plane!"). In yet another example, the profanity may be replaced by dubbing in alternate words (e.g., "I have had it with these money loving snakes on this money loving plane!").

In an example, when the attendee 200*b* toggles the profanity filter 322 on using the toggle selection 324, the app 260 may provide the selected preferences and the smartphone 122*b* may generate the signal PREF_B. The signal PREF_B may be provided to the decoder 154*b* and the decoder 154*b* may modify the selected audio track SAUD_B based on the preferences of the signal PREF_B. The decoder 154*b* may generate the personalized audio PERAUD_B with the profanity filtered.

Figure 14:
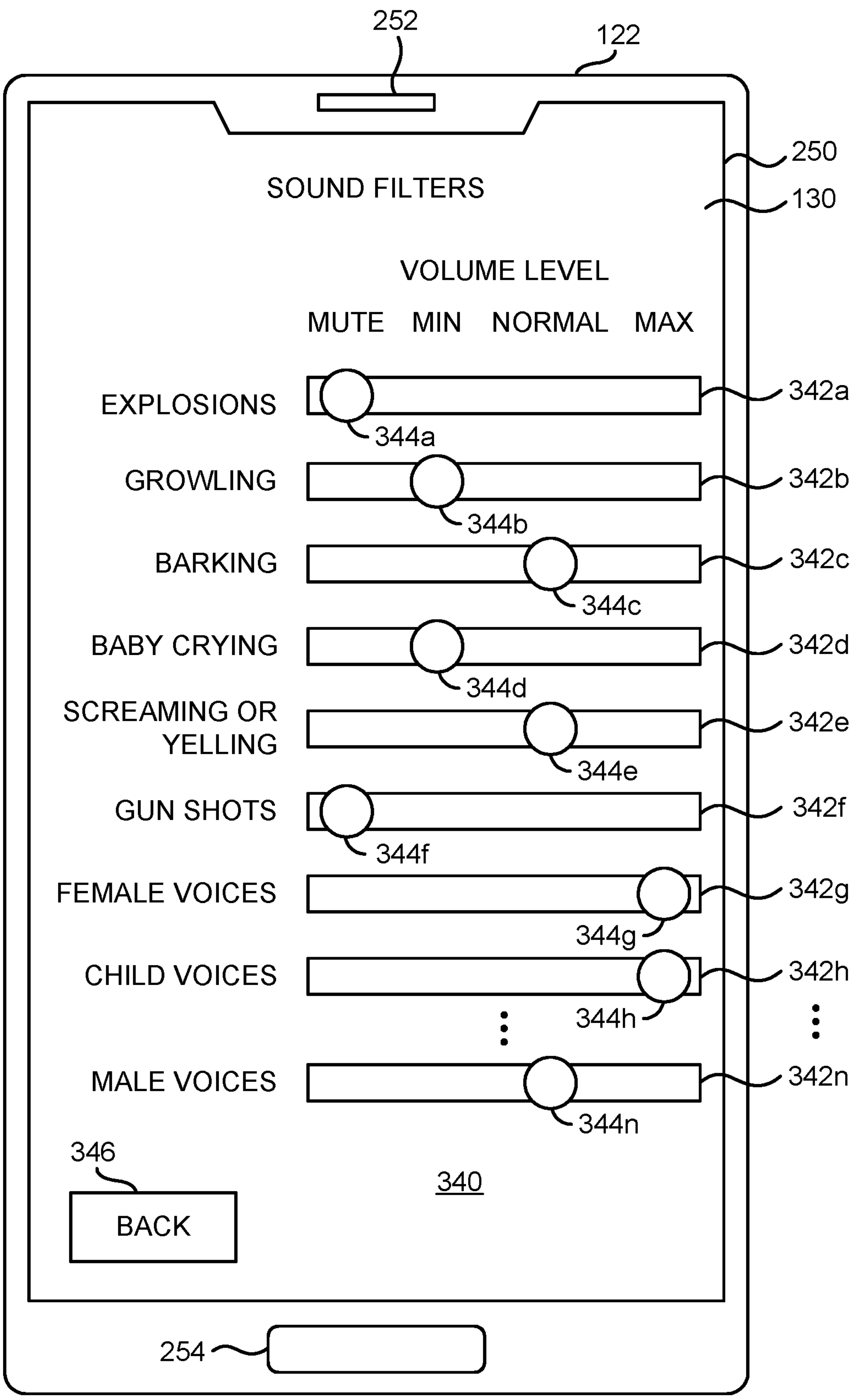
FIG. 14 is a diagram of illustrating an example interface for sound filter preferences.

Referring to FIG. 14, a diagram illustrating an example interface for sound filter preferences is shown. The smartphone 122 is shown. The touchscreen display 250, the speaker 252 and the microphone 254 of the smartphone 122 are shown. The display 250 is shown presenting the interface 130. In the example shown, the interface 130 may provide a sound filtering interface 340 of the app 260.

The sound filtering interface 340 may comprise a number of input sliders 342*a*-342*n*, input selectors 344*a*-344*n*, and a back button 346. The input sliders 342*a*-342*n* may each correspond to various sound effects. The input selectors 344*a*-344*n* may be moved using a touch interface to select values on the corresponding input sliders 342*a*-342*n*. The back button 346 may be a software button used for returning to the audio preferences interface 270.

The system 100 may be configured to filter sound effects that are similar to the sound effects of the input sliders 342*a*-342*n*. The input sliders 342*a*-342*n* may each correspond to a type of sound effect that may cause one or more of the attendees 200*a*-200*n* distress and/or annoyance. In the example shown, the sound effect 342*a* may be explosions, the sound effect 342*b* may be growling (e.g., dogs, bears, tigers, etc.), the sound effect 342*c* may be barking (or hissing), the sound effect 342*d* may be a baby crying, the sound effect 342*e* may be screaming (or yelling or shrieking), the sound effect 342*f* may be gun shots, the sound effect 342*g* may be female voices, the sound effect 342*h* may be child voices and the sound effect 342*n* may be male voices. Other types of sound effects may be filtered (e.g., squelching sounds from stab wounds, erotic moaning, etc.). In the example shown, the input selectors 344*a*-344*n* may correspond to a maximum audio value, a normal audio value, a minimum audio value and a mute value. In another example, the input selectors 344*a*-344*n* may be a percentage for a gain value that may be applied to the particular sound effect. The type of sound effects available may be varied according to the design criteria of a particular implementation.

In an example, if the attendee 200*n* moves the input selector 344*b* to the mute position, the app 260 may update the user preferences and the smartphone 122*n* may generate the signal PREF_N. The signal PREF_N may be presented to the decoder 154*n*. The decoder 154*n* may extract the user preferences from the signal PREF_N in order to modify the selected audio track SAUD_N. The decoder 154*n* may generate the personalized audio PERAUD_N for the attendee 200*n* in response to the user preferences and the selected audio track.

Figure 15:
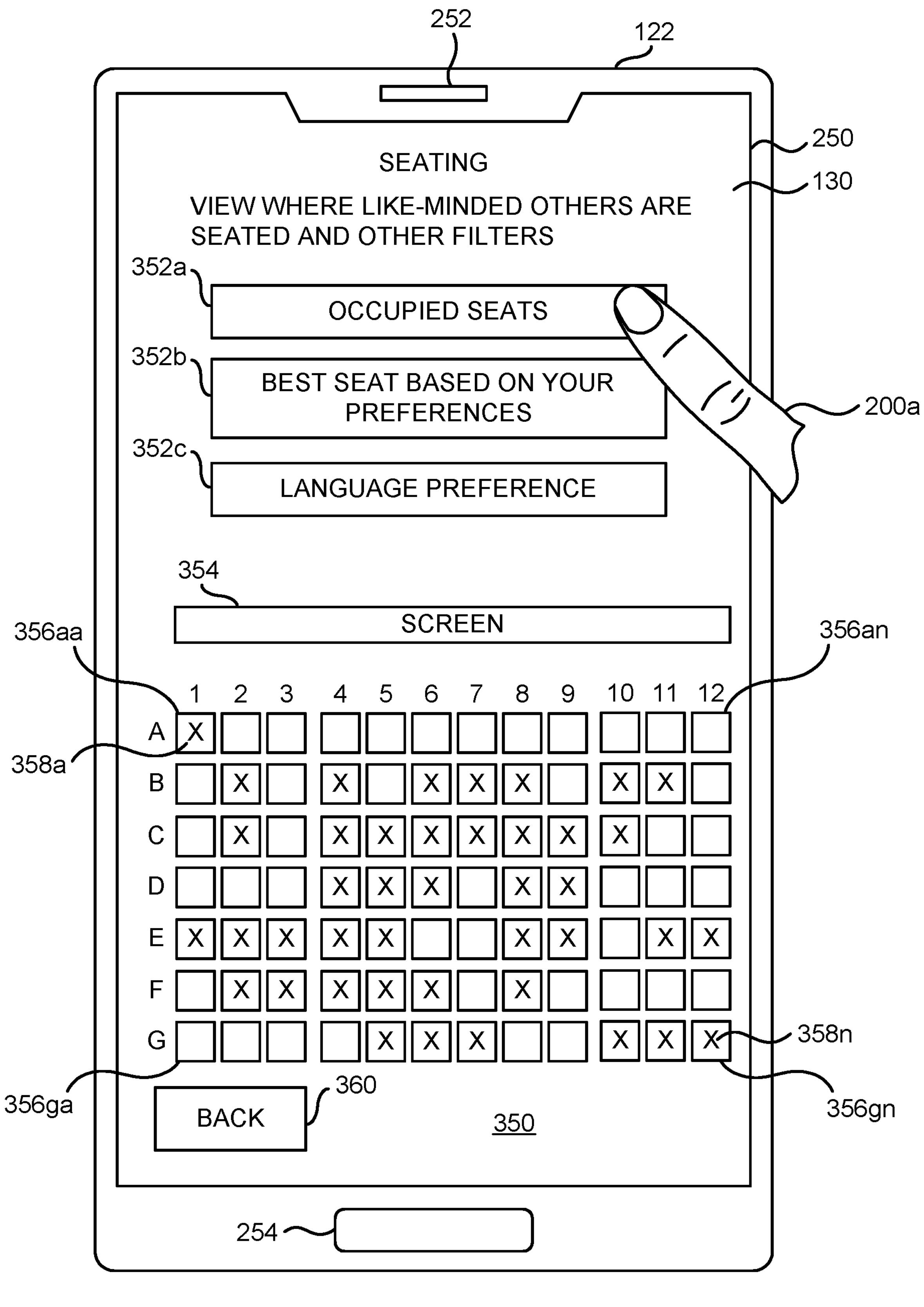
FIG. 15 is a diagram illustrating an example interface for a seating chart.

Referring to FIG. 15, a diagram illustrating an example interface for a seating chart is shown. The smartphone 122 is shown. The touchscreen display 250 and the speaker 252 and the microphone 254 of the smartphone 122 are shown. The display 250 is shown presenting the interface 130. In the example shown, the interface 130 may provide a seating chart interface 350 of the app 260. For example, the seating chart interface 350 may be accessed by selecting the button 266*a* on the companion app 260 as shown in association with FIG. 8.

The seating chart interface 350 may comprise a number of menu buttons 352*a*-352*c*, a seating chart 354, a seat layout 356*aa*-356*gn*, occupied seat indicators 358*a*-358*n* and a back button 360. The menu buttons 352*a*-352*n* may each correspond to seating-related options. The menu buttons 352*a*-352*c* may be software buttons configured to respond to the touch of the attendee 200*a*. The seating chart 354 may be configured to provide an overview of available seating in the theater 50 with respect to the location of the screen 54. For example, each of the blocks 356*aa*-356*gn* may represent one of the seats 124. The seat layout 356*aa*-356*gn* may be generated based on the arrangement of the seating areas 60*a*-60*c* for each particular theater 50. The occupied seat indicators 358*a*-358*n* may be generated to indicate which of the seats are currently occupied by one of the attendees 200*a*-200*n*. The back button 360 may be a software button used for returning to the main screen of the companion app 260.

In some embodiments, the attendees 200*a*-200*n* may use the companion app 260 to purchase tickets and/or reserve seating in the theater 50. The seating chart 354 may be configured to indicate which seats have been reserved and/or which seats are currently occupied. As the attendees 200*a*-200*n* enter the theater and sit in the seating areas 60*a*-60*c*, the occupied seat indicators 358*a*-358*n* may populate the seat layout 356*aa*-356*gn*. In one example, the attendees 200*a*-200*n* may use the companion app 260 to manually 'check in' when arriving at the theater 50 and the companion app 260 may be configured to update the seating chart 354 according to the location of the seats reserved. In another example, the companion app 260 may be configured to update the seating chart 354 as the attendees 200*a*-200*n* connect to the broadcast device 102 (e.g., when a connection is made by the headphones 120, the associated seat 124 may be considered to be occupied).

The companion app 260 may be configured to implement and/or be utilized with social networking. The companion app 260 may be configured to enable the attendees 200*a*-200*n* to find seating in the theater 50 with other of the attendees 200*a*-200*n* that share similar preferences. The preferences used by the social networking aspect of the companion app 260 may comprise one or more of the audio preferences selected using the various audio preference interfaces 270-340. The preferences may be stored by the memory 136*b* of the remote device 134 to enable the preferences to be loaded by the companion app 260 regardless of the location of the venue 50.

In the example shown, seats on the seat layout 356*aa*-356*gn* that are unoccupied may be represented by a blank box. In the example shown, seats on the seat layout 356*aa*-356*gn* that are occupied may be marked with an X. In another example, the occupied seats 358*a*-358*n* may be marked with an emoji (e.g., a smiley face). In yet another example, each of the attendees 200*a*-200*n* may use the companion app 260 to select an avatar (e.g., a profile picture, a caricature model, a personalized image, etc.) for being represented as the occupied seats 358*a*-358*n*. The customized avatars may enable friends to locate each other. In some embodiments, the occupied seats 358*a*-358*n* may provide a link to a social media profile of the corresponding attendee stored by the remote device 134. For example, the attendee 200*a* may tap (or click or hover over) on the occupied seat 358*a* and the companion app 260 may retrieve the social media profile for the attendee in the occupied seat 358*a* from the remote device 134 (e.g., a Facebook profile, a Twitter profile, an Instagram profile, a profile for a social media platform operated by the venue 50, etc.).

The sound system of the theater 50 may comprise the multiple physical speakers and/or sub woofers (e.g., the audio output devices 52*a*-52*h*) surrounding the audience in the seating areas 60*a*-60*c*. The theater sound system 52*a*-52*h* may be configured to work with the system 100 to enable an awareness of how many customers are utilizing the noise canceling headphones 120 and where the attendees 200*a*-200*n* that are using the headphones 120 are seated in the venue 50. For example, the companion app 260 may be configured to export the seating chart 354 to the processor 114 of the broadcast device 102 with the locations of the occupied seats 358*a*-358*n*. The exported data may be provided in a format compatible with an API used by the theater 50. In one example, a technician at the theater 50 may adjust the output audio levels for the audio output devices 52*a*-52*h* based on the distribution of attendees 200*a*-200*n* that are utilizing the headsets 120*a*-120*n*. In another example, the processor 114 may be configured to interpret the exported data from the seating chart 354 and automatically adjust the audio levels for the audio output devices 52*a*-52*n* based on the distribution of the attendees 200*a*-200*n* that are utilizing the headsets 120*a*-120*n*. For example, if all of the attendees 200*a*-200*n* that are utilizing the headphones 120*a*-120*n*, then the sound system 52*a*-52*h* may be disabled. In another example, if all of the attendees 200*a*-200*n* that are utilizing the headphones 120*a*-120*n* are located in one quadrant of the theater then speaker system 52*a*-52*h* corresponding to the quadrant with the attendees 200*a*-200*n* using the headphones 120*a*-120*n* may be muffled somewhat in order to make the noise canceling function of the headphones 120*a*-120*n* more effective.

Figure 16:
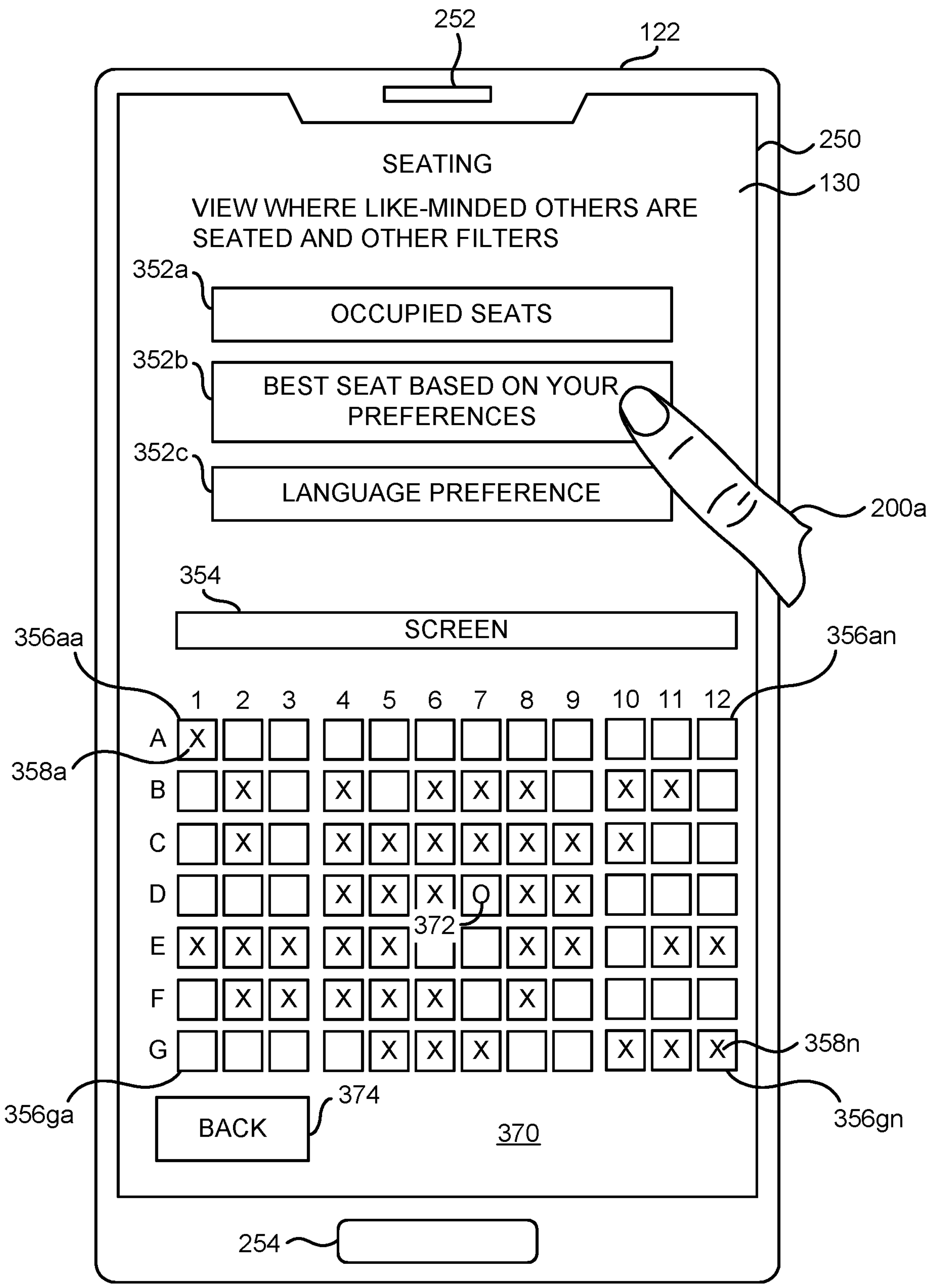
FIG. 16 is a diagram illustrating an example interface for a seat recommendation.

Referring to FIG. 16, a diagram illustrating an example interface for a seat recommendation is shown. The smartphone 122 is shown. The touchscreen display 250 and the speaker 252 and the microphone 254 of the smartphone 122 are shown. The display 250 is shown presenting the interface 130. In the example shown, the interface 130 may provide a recommendation interface 370 of the app 260. For example, the seat recommendation interface 370 may be selected by pressing the menu button 352*b*.

The seat recommendation interface 370 may comprise the menu buttons 352*a*-352*c*, the seating chart 354, the seat layout 356*aa*-356*gn* and/or the occupied seat indicators 358*a*-358*n*. An indicator 372 is shown on the seat layout 356*aa*-356*gn*. The seat recommendation interface 370 may further comprise a back button 374. The back button 374 may be a software button used for returning to the main screen of the companion app 260.

Using the seat recommendation interface 370, the attendee 200*a* may press the menu button 352*b* to receive a recommendation on where to sit in the theater 50. The recommendation may be communicated as the seat indicator 372. The companion app 260 may be configured to analyze the seat layout 356*aa*-356*gn*, the occupied seats 358*a*-358*n* and/or the preferences of the attendee 200*a*. In an example, the companion app 260 may leverage the computing resources of the processor 136*a* of the remote device 134 for the analysis. The seat indicator 372 may only be generated for one of the seats in the seat layout 356*aa*-356*gn* that is not one of the occupied seats 358*a*-358*n*. In some embodiments, the seat recommendation interface 370 may synchronize with the companion app 260 of another one of the attendees 200*a*-200*n* to find multiple recommended seats. For example, if a couple is on a date, or a group of friends want to sit together, the companion app 260 may be configured to search for multiple seats adjacent to each other, or at least close to each other (if possible based on available seating).

The recommendation for the seat location indicator 372 may be generated based on different user preferences, different audio tracks and/or other data. In some embodiments, the companion app 260 may be configured to create different sections within the theater for different preferences. For example, the attendees 200*a*-200*n* may be recommended seating locations to create clusters of attendees that have similar preferences (e.g., an English speaking section in one quadrant, a Spanish section in one quadrant, an Italian section in the third quadrant, and a Swahili in the fourth quadrant). In another example, the system 100 may be configured to assign different sections based on different user preferences and different audio tracks could be sent to different users depending on seating positions. The attendees 200*a*-200*n* may sit in different sections and experience different audio tracks based on their preferences as indicated by the seat mapping.

The recommendation for the seat location indicator 372 may be generated in order to attempt to engage the attendees 200*a*-200*n* with each other. In one example, if according to the social media information received from the remote device 134, multiple of the attendees 200_a_-200_n_ also enjoy fishing the location indicator 372 may recommend the attendees 200_a_-200_n_ that enjoy fishing to seat close together (e.g., since the attendees are watching the same movie and have a second common interest, the attendees may be more likely to interact with each other after the film). In another example, if more than one of the attendees 200_a_-200_n_ select the commentary track then the location indicator 372 may recommend the attendees 200_a_-200_n_ that are listening to the commentary track sit together (e.g., more likely to be big fans of the film that have already watched the film). In yet another example, if according to the social media information, two of the attendees 200_a_-200_n_ are single, then the location indicator 372 may recommend the single attendees sit together (e.g., provide a match-making or dating recommendation). The recommendation for the seat location indicator 372 may further take into account the user preferences (e.g., attendees that prefer to sit closer to the screen 54 may receive recommendations closer to the screen 54). The different types of factors that are used to generate the seat location indicator 372 may be varied according to the design criteria of a particular implementation.

Figure 17:
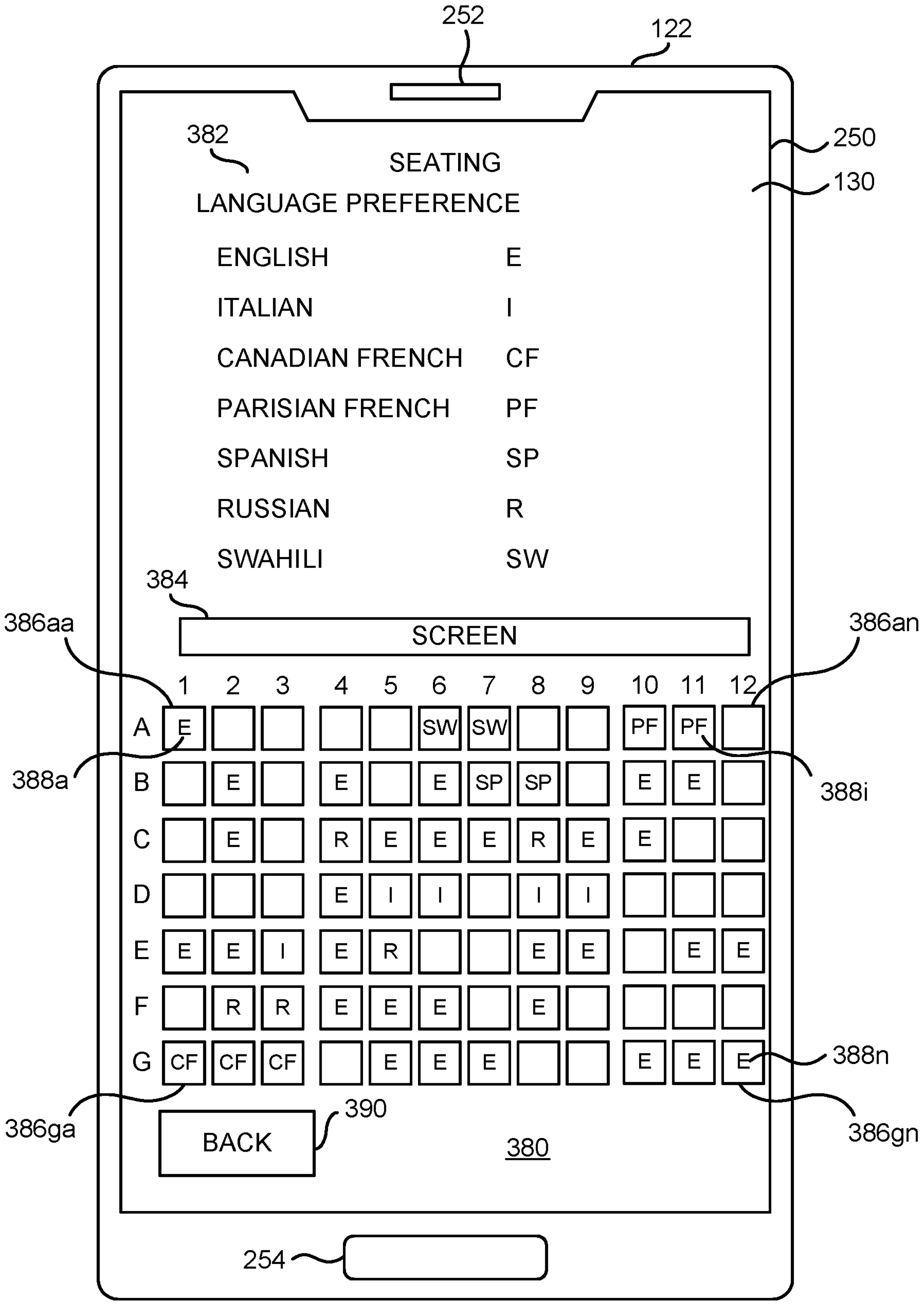
FIG. 17 is a diagram illustrating an example interface for seating information based on spoken language.

Referring to FIG. 17, a diagram illustrating an example interface for seating information based on spoken language is shown. The smartphone 122 is shown. The touchscreen display 250 and the speaker 252 and the microphone 254 of the smartphone 122 are shown. The display 250 is shown presenting the interface 130. In the example shown, the interface 130 may provide a language preference interface 380 of the app 260. For example, the language preference interface 380 may be selected by pressing the menu button 352_c_ shown in association with FIG. 15.

The language preference interface 380 may comprise a language legend 382, a language seating chart 384, a seat layout 386_aa_-386_gn_, language seat indicators 388_a_-388_n_ and/or a back button 390. The language legend 382 may comprise a list of indicators for the language of the audio tracks 112_a_-112_n_ selected by the attendees 200_a_-200_n_. The language seating chart 384 may comprise a seating chart similar to the seating chart 354 shown in association with FIG. 15. The language seating chart 384 may correspond to the layout of the theater 50 and further indicate the language of the tracks selected by each of the attendees 200_a_-200_n_. The back button 390 may be a software button used for returning to the seating chart interface 350 of the companion app 260.

The companion app 260 may be implemented with a degree of social networking enabled through the user preference profile built up for the attendees 200_a_-200_n_. The companion app 260 may be configured to access the social networking information stored by the remote device 134. For example, movie goers who choose the Italian language track may be interested in meeting and sitting beside other users that speak Italian and enjoy similar movie genres.

The seat layout 386_aa_-386_gn_ may indicate which of the seats 60_a_-60_c_ are occupied and unoccupied. The language seat indicators 388_a_-388_n_ may be similar to the seat indicators 358_a_-358_n_ but also include an indication of the language selected by the attendees 200_a_-200_n_. The language seat indicators 388_a_-388_n_ may indicate which seats are occupied based on symbols in the language legend 382. In the example shown, the language seat indicators 388_a_-388_n_ may use the letter E to indicate that the seat is occupied by an attendee that selected the English language audio track, the letter I to indicate that the seat is occupied by an attendee that selected the Italian language audio track, the letters CF to indicate that the seat is occupied by an attendee that selected the Canadian French language audio track, the letters PF to indicate that the seat is occupied by an attendee that selected the Parisian French language audio track, the letters SP to indicate that the seat is occupied by an attendee that selected the Spanish language audio track, the letter R to indicate that the seat is occupied by an attendee that selected the Russian language audio track, and the letters SW to indicate that the seat is occupied by an attendee that selected the Swahili language audio track.

Providing information that allows the attendees 200_a_-200_n_ to know which languages are preferred by which of the attendees 200_a_-200_n_ may encourage user engagement (e.g., by being able to speak comfortably with nearby attendees). For example, the attendees 200_a_-200_n_ that enter the theater 50 and would prefer to sit near other attendees that speak Canadian French may be provided with the information from the language seating chart 384 to know to sit in the back left of the theater 50. In another example, attendees 200_a_-200_n_ that prefer to speak in Swahili may decide to sit in the front center seats based on the information provided by the languages preference interface 380. One strategy for learning a new language is to watch movies in the language, and the companion app 260 may help a user learning a particular language find another attendee that speaks the language to ask questions.

Figure 18:
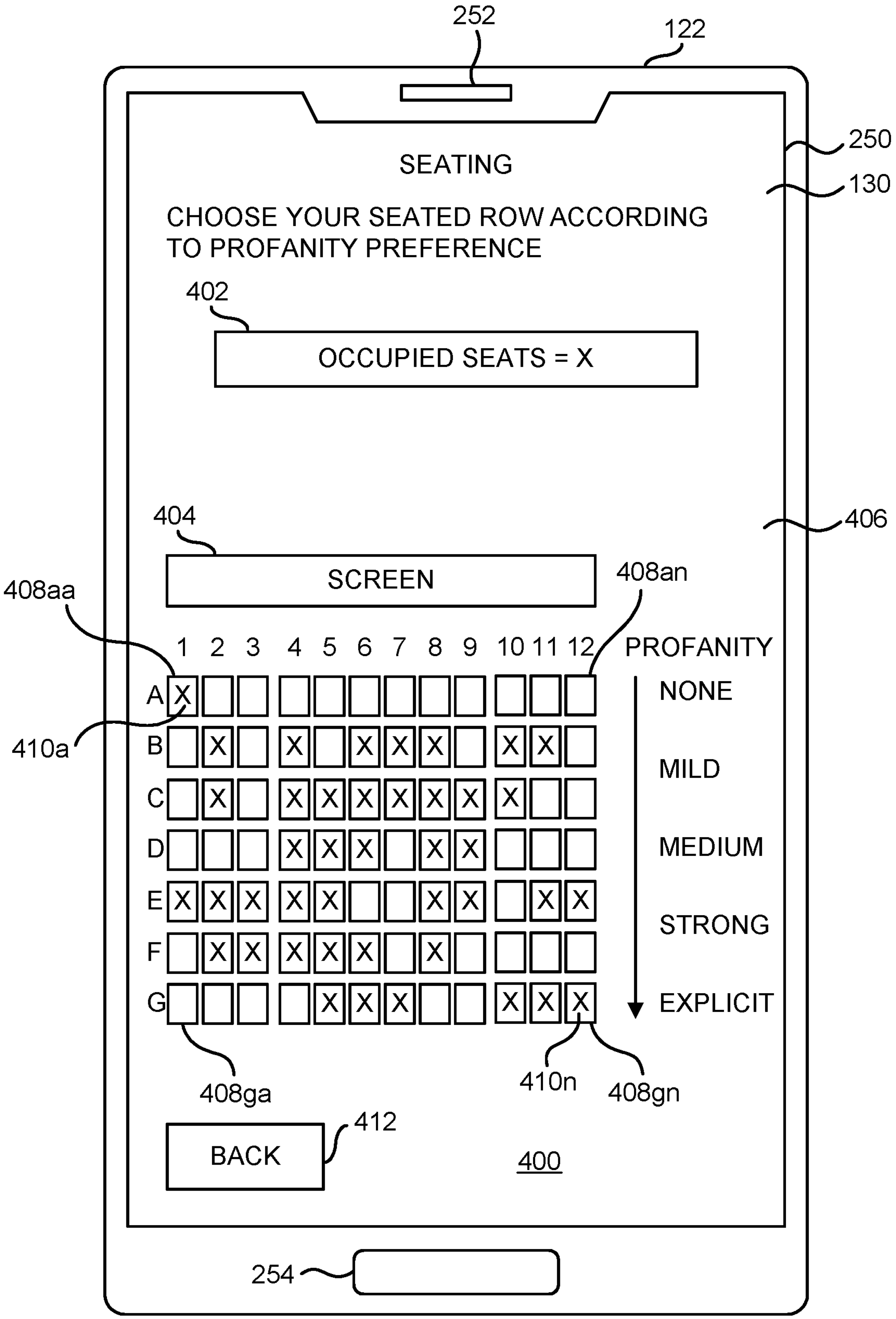
FIG. 18 is a diagram illustrating an example interface for seating information based on profanity level.

Referring to FIG. 18, a diagram illustrating an example interface for seating information based on profanity level is shown. The smartphone 122 is shown. The touchscreen display 250 and the speaker 252 and the microphone 254 of the smartphone 122 are shown. The display 250 is shown presenting the interface 130. In the example shown, the interface 130 may provide a profanity level interface 400 of the app 260. While profanity level is used as a representative example, the companion app 260 may comprise similar interfaces for other types of user preferences (e.g., sound level of explosions, musical instrument preferences for live concerts, sound level for dogs barking, etc.).

The profanity level interface 400 may comprise a preference legend 402, a preference seating chart 404, a seat layout 408_aa_-408_gn_, preference seat indicators 410_a_-410_n_ and/or a back button 412. The preference legend 402 may comprise a list of indicators for the preference seating chart 404. In the example shown, the preference legend 402 may indicate that an X marks an occupied seat. The preference seating chart 404 may comprise a seating chart similar to the seating chart 354 shown in association with FIG. 15. The preference seating chart 404 may correspond to the layout of the theater 50 and further indicate which sections of the theater 50 are occupied by the attendees 200_a_-200_n_ having similar preferences. In the example shown, for the preference of profanity level, the attendees 200_a_-200_n_ that prefer no profanity may be located near the front of the theater 50, and the attendees 200_a_-200_n_ that prefer no censorship of the profanity may be located near the back of the theater 50. For example, parents attending a movie with younger children may want their children seated near the front of the theater 50 where other users are also not selecting to hear profanity to avoid the child accidentally hearing the profanity (e.g., audience members repeating or quoting a scene). The back button 412 may be a software button used for returning to the seating chart interface 350 of the companion app 260.

The seat layout 408_aa_-408_gn_ and the preference seat indicators 410_a_-410_n_ may have a similar implementation as the seat layout 356_aa_-356_gn_ and the occupied seat indicators 358_a_-358_n_. The seat layout 408_aa_-408_gn_ and the preference seat indicators 410_a_-410_n_ may provide information to the attendees 200_a_-200_n_ about which seats are available based on the preference (e.g., the level of profanity, in the example shown). For example, if all the seats in the no profanity section are indicated as occupied, a user may decide to go to another viewing.

In some embodiments, the preferences may be subtle and/or granular where patrons sitting at the front of the theater 50 may be served audio with more extreme volume fluctuations, pronounced explosion sounds, more disturbing profanity laced dialogue, etc. Users seated in the middle section receive the 'director's cut' with no elevated volume, some profanity, etc. Users in the back may receive a toned down version with little audio fluctuation, bleeped profanity or substituted dialogue for profanity, etc. There may be one hundred rows in the theater 50 and the attendees 200*a*-200*n* may choose a viewing experience based on a row number with a similar granularity for a particular preference. In another example, users that have been traumatized by dogs may choose to mute all dog sounds and may wish to sit beside others who do the same and enjoy some comfort and support through proximity to each other as they endure segments of a film with dogs. The types of preferences and/or the granularity for exposure to the preferences may be varied according to the design criteria of a particular implementation.

The companion app 260 may be implemented on the smartphone 122. In some scenarios, the user may prefer to use the other functionality of the smartphone 122 during the event (e.g., check social media feeds while watching a movie). The companion app 260 may be configured to mute or muffle the volume of the film if the companion app 260 is moved to the background (e.g., when the smartphone 122 is being used by the user for another application).

The companion app 260 may be configured to perform updates in real-time. The various interfaces 270-400 may be interacted with to enable the attendees 200*a*-200*n* to adjust various preferences as the movie progresses. For example, the user may not enjoy the music played during the opening credits and slide the audio level down and then slide the audio level back up once the actual movie begins. In another example, the user may have difficulty hearing a particular dialogue sequence and adjust the volume up in real-time. The audio decoder 154 may re-configure the audio output to enable the headphones 120 to playback the audio as desired by the user.

In some embodiments, the headphones 120 may comprise glasses and/or video screens (e.g., built in or as a separate attachment and/or premium feature). The glasses and/or video screens may be configured to playback the video of the movie. For example, similar to adjusting the audio track, the glasses and/or video screens may be configured to enhance the video in a personalized way. For example, the video may be enhanced by providing 3D, personalized color settings, personalized contrast, violence and/or nudity filtering, etc.).

In some embodiments, the glasses attached to the headphones 120 may comprise inward facing camera to monitor and/or track a gaze direction of the attendees 200*a*-200*n*. For example, movie screens are very large and the attendees 200*a*-200*n* may look at only a portion of the screen 54. The audio output may be modified in response to the gaze direction detected by the cameras. For example, if the movie has a scene with two actors on the screen 54 (e.g., one on the right side and one the left side), and the user is looking at the left portion of the screen 54 the audio for the actor on the left side may be enhanced (e.g., increased volume level, more subtleties like breathing noises, etc.) and the audio for the actor on the right side of the screen 54 may be de-emphasized correspondingly. The attendees 200*a*-200*n* may look at the portion of the screen 54 that they want to hear enhanced audio for and, based on the gaze direction detected, the audio decoder 154 may adjust the output audio in real-time. Adjusting the audio to where the user is looking may provide a more immersive experience.

Figure 19:
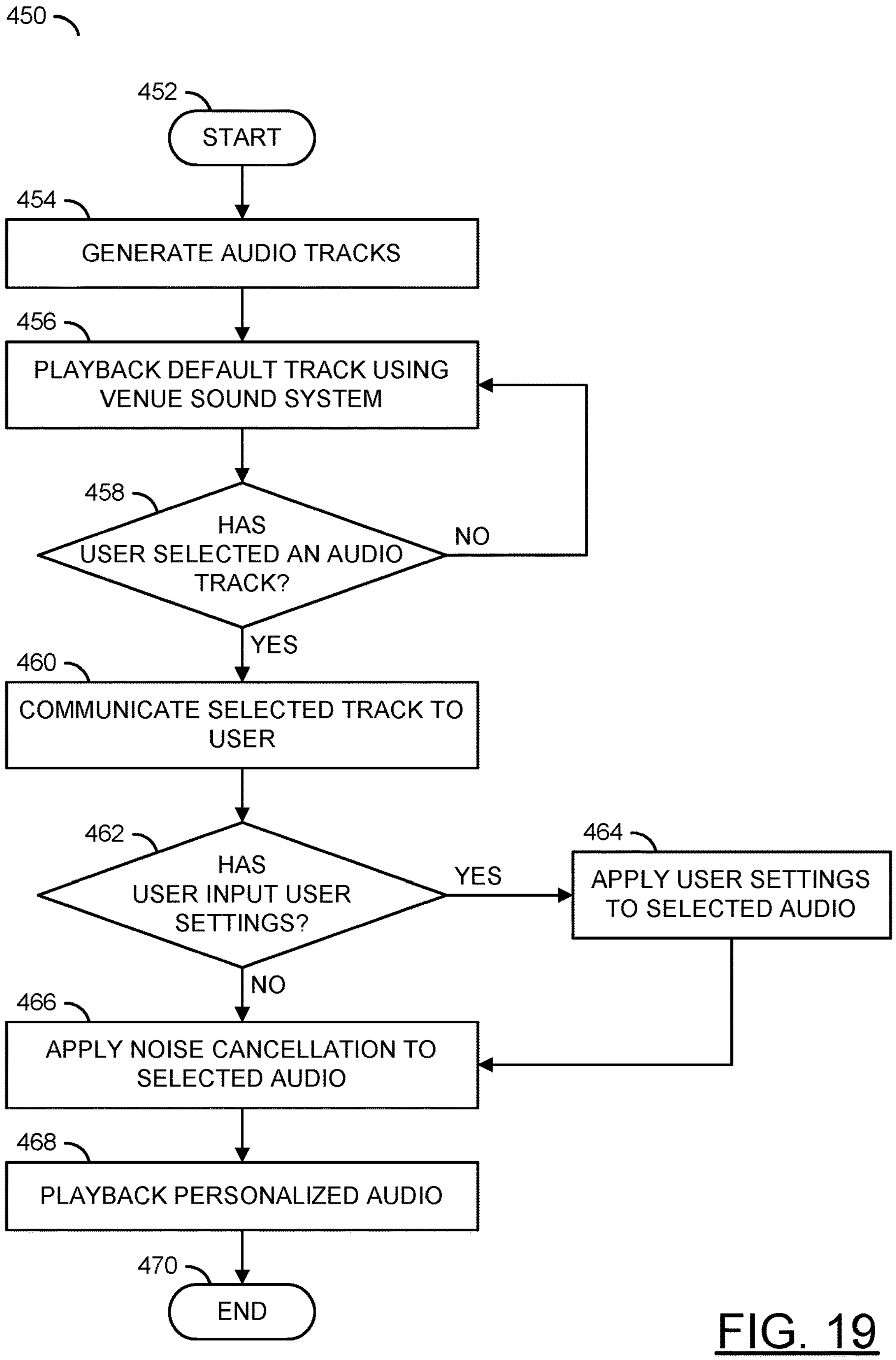
FIG. 19 is a flow diagram illustrating a method for generating a personalized audio track for an event.

Referring to FIG. 19, a method (or process) 450 is shown. The method 450 may generate a personalized audio track for an event. The method 450 generally comprises a step (or state) 452, a step (or state) 454, a step (or state) 456, a decision step (or state) 458, a step (or state) 460, a decision step (or state) 462, a step (or state) 464, a step (or state) 466, a step (or state) 468, and a step (or state) 470.

The step 452 may start the method 450. In the step 458, the audio broadcast device 102 may generate the audio tracks 112*a*-112*n*. Next, in the step 456, the processor 114 of the audio broadcast device 102 may playback a default one of the audio tracks 112*a*-112*n* using the sound system 52*a*-52*h* of the venue 50. Next, the method 450 may move to the decision step 458.

In the decision step 458, the interface 130 may determine whether one of the attendees (e.g., the attendee 200*a*) has selected an audio track. For example, the attendee 200*a* may use the smartphone 122 to generate the signal SEL_A to select one of the audio tracks 112*a*-112*n*. If the attendee 200*a* has not selected one of the audio tracks 112*a*-112*n*, then the method 450 may return to the step 456. If the attendee 200*a* has selected one of the audio tracks 112*a*-112*n*, then the method 450 may move to the step 460. In the step 460, the audio broadcast device 102 may communicate the selected audio track to the headset 120 of the attendee 200*a*. For example, the processor 114 may generate the signal SAUD_A in response to the signal SEL_A. Next, the method 450 may move to the decision step 462.

In the decision step 462, the processor 162 of the headset 120*a* may determine whether the user has provided any input settings. For example, the attendee 200*a* may use the smartphone 122*a* to select user settings. The user settings may be generated as the signal PREF_A and communicated to the decoder 154*a* of the headset 120*a*. If the user has provided the user settings, the method 450 may move to the step 464. In the step 464, the decoder 154*a* may apply the user settings PREF_A to the selected audio signal SAUD_A. Next, the method 450 may move to the step 466.

In the step 462, if the user has not provided the user settings, the method 450 may move to the step 466. In the step 466, the noise cancellation module 152*a* may apply the noise cancellation to cancel the ambient audio at the venue 50. Next, in the step 468, the decoder 154*a* and/or the noise cancellation module 152*a* may enable playback of the personalized audio. For example, the decoder 154*a* may use the selected audio track SAUD_A, apply the user preferences PREF_A, then the noise cancellation module 152*a* may cancel the ambient noise and generate the personalized audio PERAUD_A. Next, the method 450 may move to the step 470. The step 470 may end the method 450.

Figure 20:
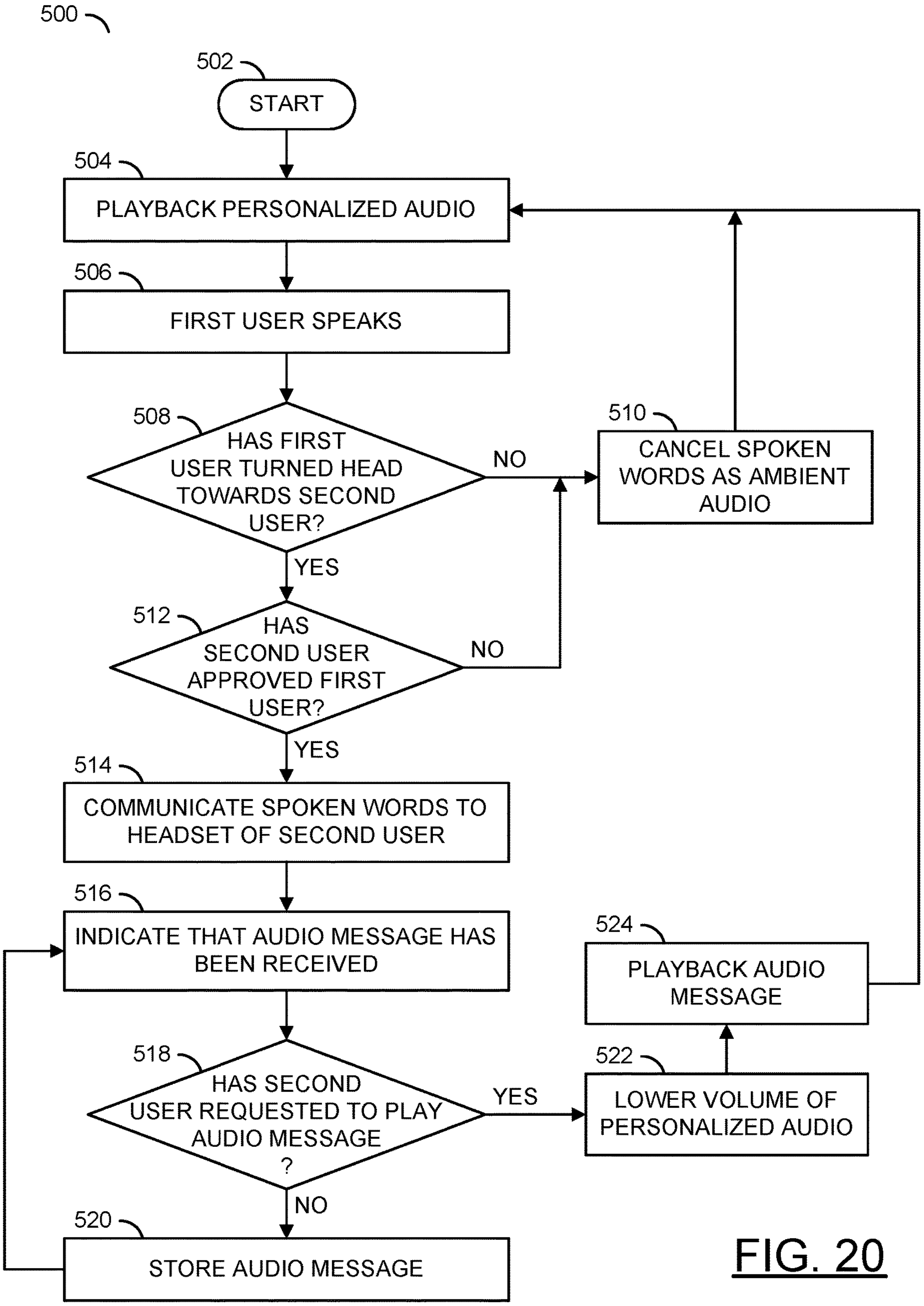
FIG. 20 is a flow diagram illustrating a method for enabling direct communication between attendees using headsets.

Referring to FIG. 20, a method (or process) 500 is shown. The method 500 may enable direct communication between attendees using headsets. The method 500 generally comprises a step (or state) 502, a step (or state) 504, a step (or state) 506, a decision step (or state) 508, a step (or state) 510, a decision step (or state) 512, a step (or state) 514, a step (or state) 516, a decision step (or state) 518, a step (or state) 520, a step (or state) 522, and a step (or state) 524.

The step 502 may start the method 500. In the step 504, the headphones 120 may playback the personalized audio (e.g., one of the signals PERAUD_A-PERAUD_N). Next, in the step 506, the attendee (e.g., the attendee 200*a*) may speak. In one example, the attendee 200*a* may speak into the microphone 160 of the headset 120*a*. In another example, the voice of the attendee 200*a* may be picked up by the noise cancellation module 152. Next, the method 500 may move to the decision step 508.

In the decision step 508, the motion sensing module 156 may determine whether the head of the attendee 200*a* has turned towards a second user (e.g., the attendee 200*b*). For example, the motion sensing module 156 may detect the direction change 242 and/or the proximity change 244 (e.g., determine whether the attendee 200*a* is facing the screen 54 or has turned to the side or leaned towards where another of the attendees 200*a*-200*n* would be seated). A similar decision may be made by the processor 162 if the microphone 160 is configured to detect when the attendee 200*a* is speaking (e.g., communication is enabled based on audio capture instead of motion). If the motion sensing module 156 determines that the attendee 200*a* has not turned towards the second attendee 200*b*, then the method 500 may move to the step 510. In the step 510, the headsets 120*a*-120*n* of the attendees 200*a*-200*n* may cancel the sounds of the first attendee 200*a* (e.g., the spoken words) as part of canceling the ambient audio. Next, the method 500 may return to the step 504. In the decision step 508, if the motion sensing module 156 determines that the attendee 200*a* has turned towards the second attendee 200*b*, then the method 500 may move to the decision step 512.

In the decision step 512, the processor 162 and/or the processor 138*a* may determine whether the second attendee 200*b* has approved of the first attendee 200*a*. For example, the attendees 200*a*-200*n* may use the smartphones 122*a*-122*n* and/or the companion app 260 to pre-approve audio messages from other of the attendees 200*a*-200*n* (e.g., an ID of the source of the pre-approved messages may be stored by the remote device 134). Audio messages from attendees 200*a*-200*n* that are not pre-approved may be automatically blocked and/or may have to be approved before the audio message is played through the speakers 150. If the second attendee 200*b* has not approved the first attendee 200*a*, then the method 500 may move to the step 510. If the second attendee 200*b* has approved of the first attendee 200*a*, then the method 500 may move to the step 514.

In the step 514, the headset 120*a* of the first attendee 200*a* may communicate the audio message (e.g., the captured audio of the spoken words captured by the microphone 160) to the headset 120*b* of the second attendee 200*b*. Next, in the step 516, the processor 162 of the headset 120*b* of the second attendee 200*b* may provide an indication that the audio message has been received. For example, the headset 120*b* may have the LED 166 provide an indicator light. The LED 166 may also be used by the sender of the audio message to know that the audio message has been received by the intended recipient(s). In another example, the smartphone 122*b* may provide a notification that the audio message has been received. In yet another example, the processor 162 of the headset 120*b* may generate a subtle audio tone so that the recipient attendee 200*b* has a notification that the audio message has been received. In some embodiments, the audio buffer for incoming messages may not be implemented, and the audio message may be played as soon as the audio message has been received. Next, the method 500 may move to decision step 518.

In the decision step 518, the processor 162 of the headphones 120*b* of the second attendee 200*b* may determine whether the second attendee 200*b* has requested to play the received audio message. For example, the second attendee 200*b* may use the interface 130" on the headphones 120*b* to playback the audio message and/or use the smartphone 122*b* to initiate playing the audio message. If the second attendee 200*b* has not approved the audio message, then the method 500 may move to the step 520. In the step 520, the headphones 120*b* may store the audio message (e.g., temporarily in a memory buffer implemented in each of the headphones 120*a*-120*n*). Next, the method 500 may return to the step 516.

In the decision step 518, if the second attendee 200*b* has requested to play the audio message, then the method 500 may move to the step 522. In the step 522, the decoder 154*b* may lower the volume of the personalized audio PERAUD_B (e.g., lower the movie volume so that the attendee 200*b* can hear the audio message). Next, in the step 524, the headphones 120*b* may playback the audio message (and the audio message may be removed from the memory buffer). The LED 166 may change to notify the sender of the audio message that the recipient attendee 200*b* has listened to the message (e.g., the LED 166 may blink or change color while the attendee 200*b* is listening to the audio message and then turn off when the audio message playback is complete). Next, the method 500 may return to the step 504.

Figure 21:
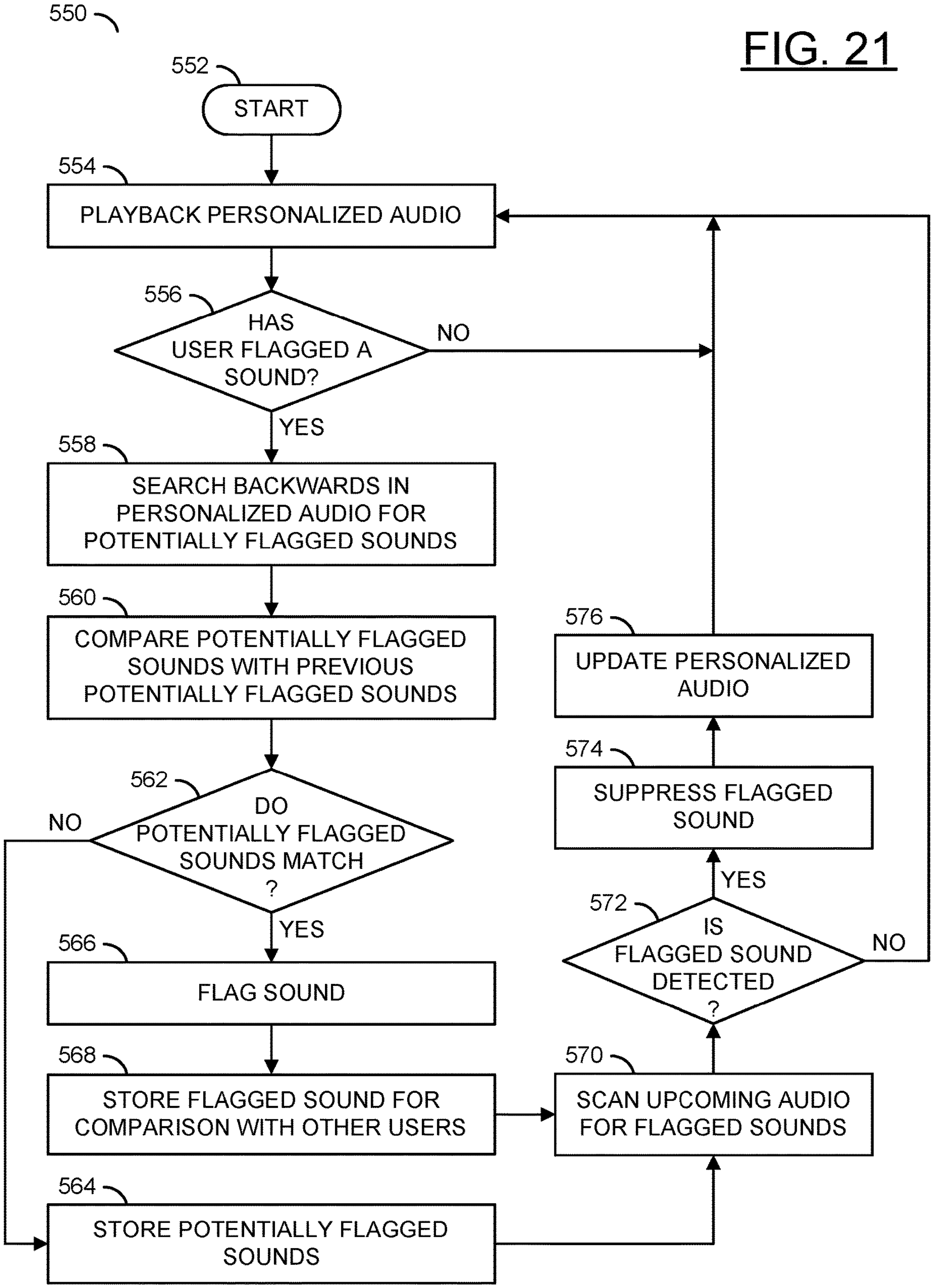
FIG. 21 is a flow diagram illustrating a method for flagging and suppressing audio in response to user input.

Referring to FIG. 21, a method (or process) 550 is shown. The method 550 may flag and suppress audio in response to user input. The method 550 generally comprises a step (or state) 552, a step (or state) 554, a decision step (or state) 556, a step (or state) 558, a step (or state) 560, a decision step (or state) 562, a step (or state) 564, a step (or state) 566, a step (or state) 568, a step (or state) 570, a decision step (or state) 572, a step (or state) 574, and a step (or state) 576.

The step 552 may start the method 550. In the step 554, the headphones 120*a* may playback the personalized audio (e.g., the speakers 150*a* may play the corresponding personalized audio PERAUD_A). Next, the method 550 may move to the decision step 556. In the decision step 556, the interface 130 may determine whether the attendee 200*a* has flagged a sound. For example, the interface 130 may provide the audio tagging button that enables the attendee 200*a* to indicate when a sound occurs in the personalized audio PERAUD_A that the attendee 200*a* would like to have muted (or played at a lower volume) in the future. For example, in response to the attendees 200*a*-200*n* flagging the sounds, the system 100 may be configured to use artificial intelligence to mute/quiet similar sounds. In one example, the machine learning module 118*a* of the processor 114 may detect and/or prevent similar sounds. In another example, the artificial intelligence may be performed by the processor 136*a* of the remote device 134.

In the decision step 556, if the attendee 200*a* has not flagged a sound, then the method 550 may return to the step 554. If the attendee 200*a* has flagged a sound, then the method 550 may move to the step 558. In the step 558, the system 100 (e.g., the processor 114 or the processor 162 of the headphones 120*a*) may search backwards in the personalized audio PERAUD_A to search for potentially flagged sounds. Since an average response time for humans is in the range of 200 ms, the attendee 200*a* may take 500 ms-1000 ms (or more) to react and physically move to press the button to flag the offensive sound (e.g., different sounds may be currently playing by the time the processor 162 actually receives the input, which could result in muting the wrong sounds). For example, if the attendee 200*a* wants to flag a gunshot, the gunshot would be heard by the attendee 200*a*, then the attendee 200*a* would flag the sound, but by the time the attendee 200*a* actually provides input the gunshot sound would be over. The system 100 may implement an artificial intelligence configured to search backwards (e.g., 1200 ms to 2000 ms or more) from the time when the attendee 200*a* provides the flagging input in order to detect potentially offensive sounds. For example, the processor 136*a* of the remote device 134 may detect sounds that are known to cause distress to users (e.g., based on statistical information) such as explosions, gunshots, animals growling, etc.). Next, in the step 560, the processor 136*a* may compare potentially flagged sounds with sounds that have previously been determined to be potentially flagged sounds. For example, each time the attendees 200*a*-200*n* provide input to flag sounds the system 100 may perform the backwards search in the audio to detect sounds and compare the potentially flagged sounds with previous potentially flagged sounds. Next, the method 550 may move to the decision step 562.

In the decision step 562, the processor 114 may determine whether the potentially flagged sounds (e.g., the currently flagged sounds and the previously flagged sounds) match. If the sounds do not match, then the method 550 may move to the step 564. In the step 564, the storage 104 may store the potentially flagged sounds (e.g., for comparison with other potentially flagged sounds in the step 560). Next, the method 550 may move to the step 570.

In the decision step 562, if the potentially flagged sounds do match, then the method 550 may move to the step 566. In the step 566, the processor 114 may flag the sound. Next, in the step 568, the flagged sound may be stored by the storage 104 for comparison with other users. For example, over time the system 100 may be able to identify commonalities in each audio sequence that is flagged. The artificial intelligence may be configured to look for commonalities within audio sequences tagged for each person within each movie, and also with multiple people within each movie and multiple people across multiple movies. In one example, if many people are tagging blaster sounds within multiple audio sequences within a given movie when one person watches the movie and tags a sequence containing a similar sound there may be a high probability that the person is trying to mute the blaster sound that other viewers that have already watched the film have flagged (e.g., crowdsourcing). Next, the method 550 may move to the step 570.

In the step 570, the processor 114 (or the processor 136*b* of the remote device 134) may scan upcoming audio for flagged sounds. In one example, the selected audio track SAUD_A may be scanned by the decoder 154*a* for audio signatures that match the flagged sound (e.g., before generating the personalized audio signal PERAUD_A). Next, the method 550 may move to the decision step 572. In the decision step 572, the decoder 154*a* may determine whether the flagged sound is detected. If the flagged sound is not detected, the method 550 may return to the step 554 (e.g., generate the personalized audio signal PERAUD_A). If the flagged sound is detected, the method 550 may move to the step 574. In the step 574, the decoder 154*a* may suppress the flagged sound (e.g., reduce volume, mute entirely, replace with another sound, etc.). Next, in the step 576, the decoder 154*a* may update the personalized audio PERAUD_A with the suppressed sounds. Next, the method 550 may return to the step 554.

Figure 22:
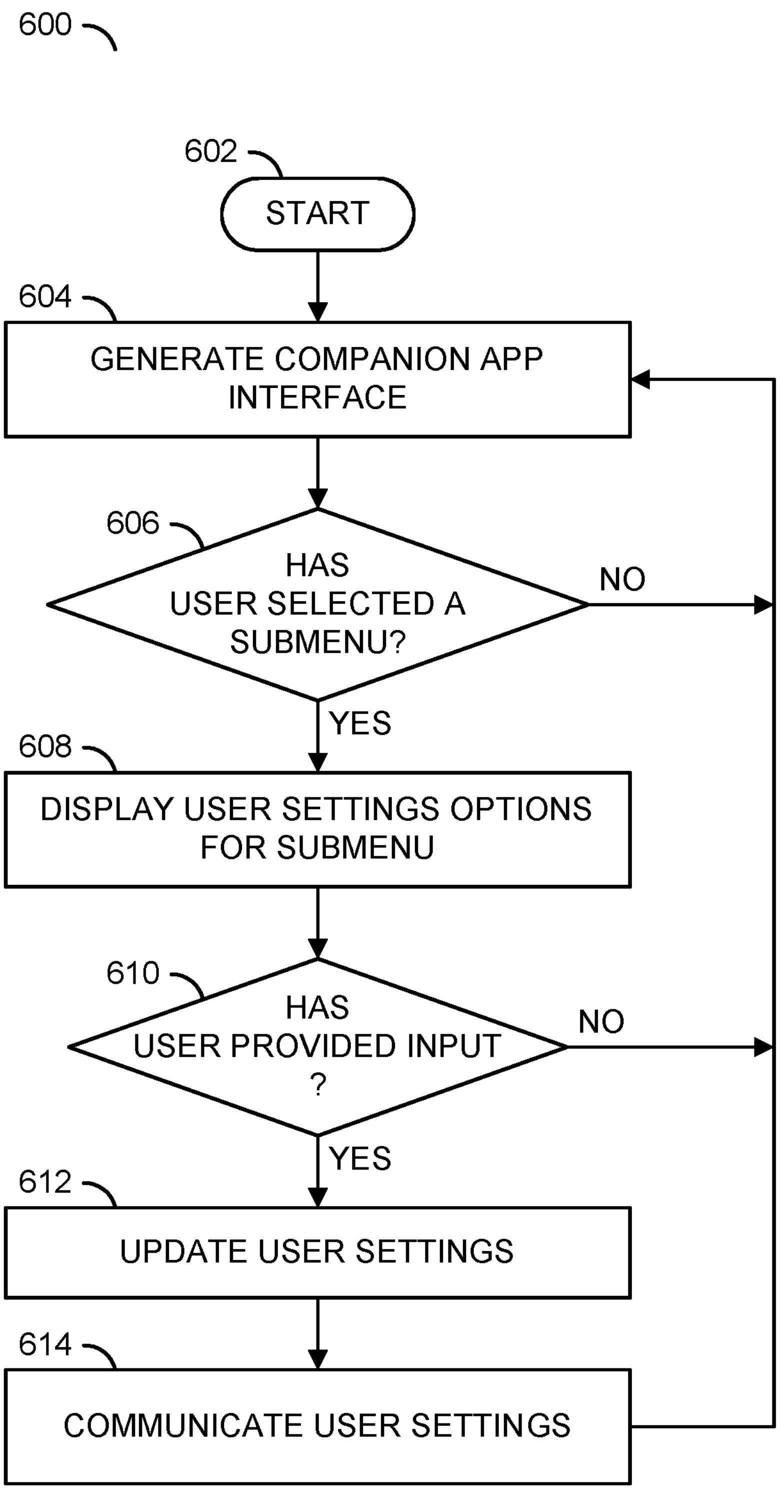
FIG. 22 is a flow diagram illustrating a method for updating user settings with a companion app.

Referring to FIG. 22, a method (or process) 600 is shown. The method 600 may update user settings with a companion app. The method 600 generally comprises a step (or state) 602, a step (or state) 604, a decision step (or state) 606, a step (or state) 608, a decision step (or state) 610, a step (or state) 612, and a step (or state) 614.

The step 602 may start the method 600. In the step 604, the smartphone 122 may generate the interface 130 for the companion app 260. Next, the method 600 may move to the decision step 606. In the decision step 606, the smartphone 122 (e.g., the touchscreen interface 250) may determine whether the user (e.g., the attendee 200*a*) has selected a submenu. For example, in the companion app 260, the user may select one of the menus options 266*a*-266*c*. In another example, in the audio preferences interface 270, the user may select one of the audio menu options 272*a*-272*n*. If the user has not selected a submenu, then the method 600 may return to the step 604. If the user has selected a submenu, then the method 600 may move to the step 608.

In the step 608, the smartphone 122 may display the user settings options for the submenu. For example, if in the decision step 606 the user selected the basic audio levels option 272*c*, then the smartphone 122 may display the basic audio levels interface 310 shown in association with FIG. 12. Next, the method 600 may move to the decision step 610.

In the decision step 610, the smartphone 122 may determine whether the attendee 200*a* has provided input. For example, for the basic audio levels interface 310, the input may be moving the current input 314*a*-314*c* for the input sliders 312*a*-312*c*. If the attendee 200*a* has not provided input, then the method 600 may return to the step 604. If the attendee 200*a* has provided input, then the method 600 may move to the step 612.

In the step 612, the smartphone 122 may update the user settings in response to the input from the user. Next, in the step 614, the smartphone 122*a* may generate and communicate the signal PREF_A to the decoder 154*a* to update the user settings. In another example, the signal PREF_A may be communicated to the remote device 134 (e.g., to enable the user preferences to be stored in the memory 136*b*). In yet another example, the signal PREF_A may be communicated to the processor 114 and the processor 114 may adjust the audio tracks 112*a*-112*n* to provide the personalized audio PERAUD_A. Next, the method 600 may return to the step 604.

Figure 23:
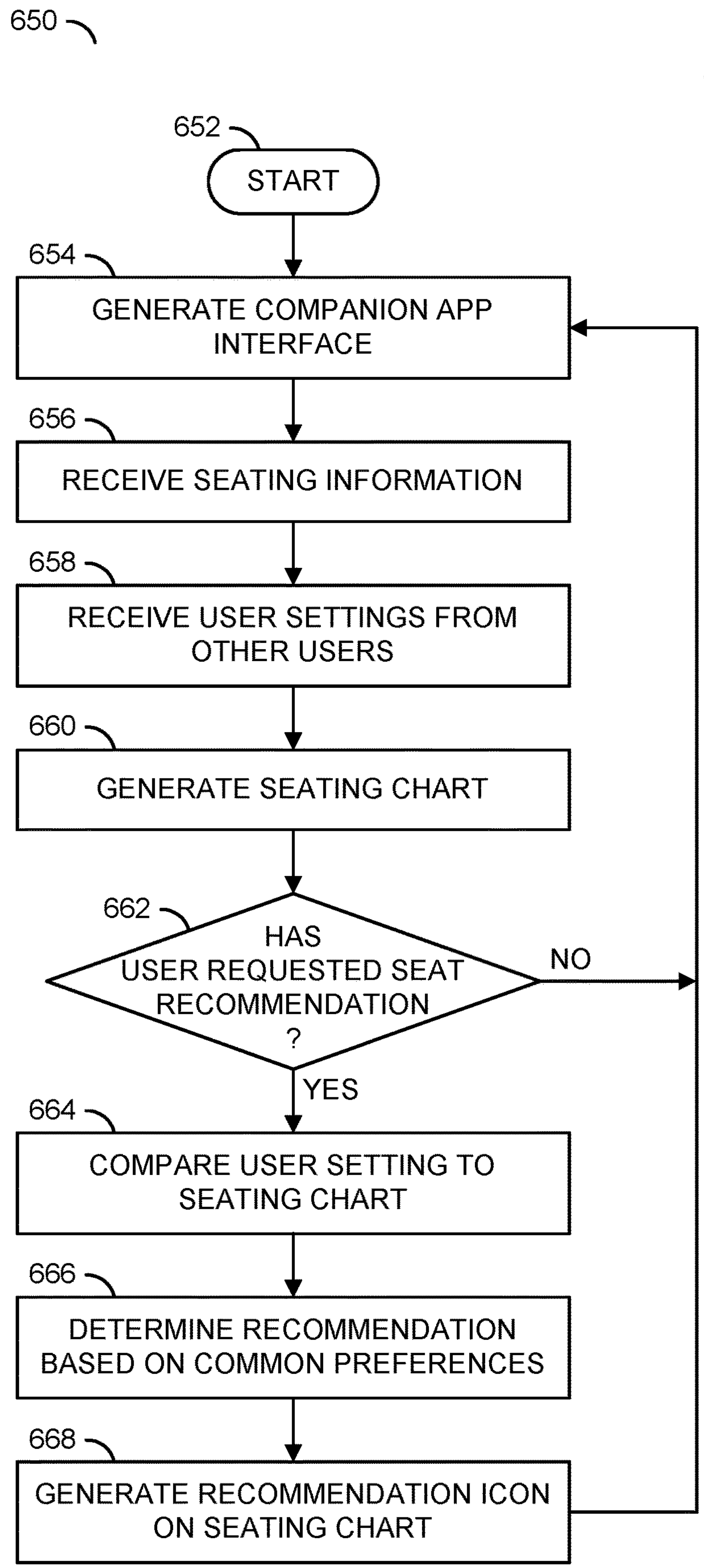
FIG. 23 is a flow diagram illustrating generating a seating recommendation based on preferences of the audience.

Referring to FIG. 23, a method (or process) 650 is shown. The method 650 may generate a seating recommendation based on preferences of the audience. The method 650 generally comprises a step (or state) 652, a step (or state) 654, a step (or state) 656, a step (or state) 658, a step (or state) 660, a decision step (or state) 662, a step (or state) 664, a step (or state) 666, and a step (or state) 668.

The step 652 may start the method 650. In the step 654, the smartphone 122 may generate the seating chart interface 350 for the companion app 260. Next, in the step 656, the smartphone 122 may connect to the audio broadcast system 102 in order to receive the seating information for the venue 50. In the step 658, the smartphone 122 may download the user settings and/or language selected by other users. In one example, the companion app 260 may download the user settings and/or language selected from the memory 136*b* of the remote device 134. In another example, the companion app 260 of each of the attendees 200*a*-200*n* may upload the user settings and/or language selected by each user to the storage 104 of the audio broadcast system 102 and the audio broadcast system 102 may provide the uploaded information to the companion app 260 used by each of the attendees 200*a*-200*n*. In an example, the user settings may comprise the language selected, the amount of profanity filtered, the offensive sounds filtered, etc. Next, in the step 660, the companion app 260 may generate the seating chart 354 to indicate which of the seats are occupied and/or which occupied seats 358*a*-358*n* correspond to the user settings (e.g., E for English language, I for Italian language, etc. as shown in the language seating chart 384 shown in association with FIG. 17). Next, the method 650 may move to the decision step 662.

In the decision step 662, the companion app 260 may determine whether the user has requested a seat recommendation. For example, the attendee 200*a* may request the seat recommendation by pressing the menu option button 352*b*. If the user has not requested the seat recommendation, then the method 600 may return to the step 654. If the user has requested the seat recommendation, then the method 650 may move to the step 664.

In the step 664, the companion app 260 may compare the user settings of the attendee 200*a* to the seating chart 354. Next, in the step 666 the companion app 260 may determine the recommendation based on common preferences (e.g., between the user settings of the attendee 200*a* and the user settings selected for each of the occupied seats 358*a*-358*n*). In the step 668, the companion app 260 may generate the recommendation notification 372. The recommendation notification 372 may be an icon generated on the seating chart 354. Next, the method 650 may return to the step 654.

Figure 24:
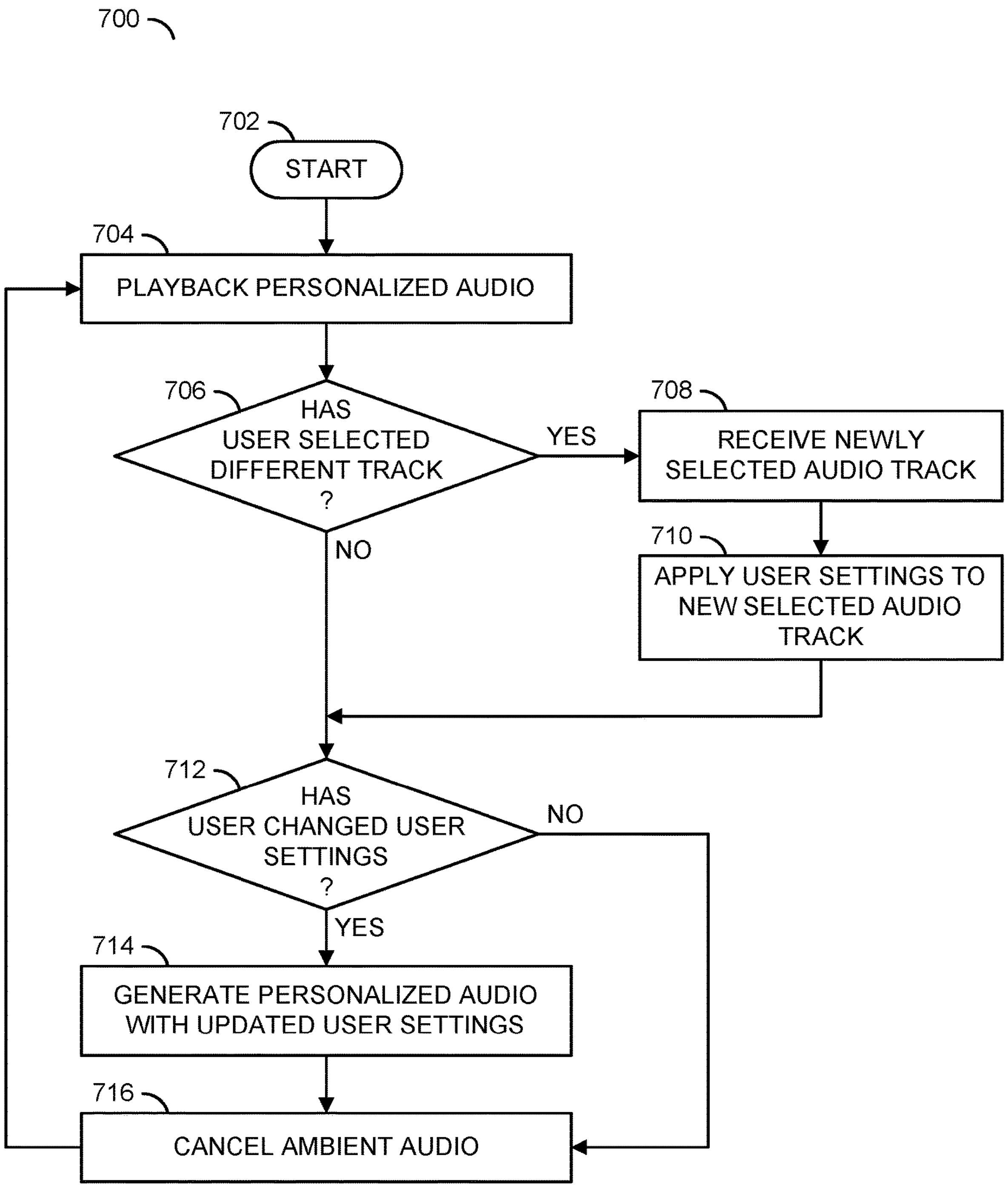
FIG. 24 is a flow diagram illustrating updating a personalized audio track in real time.

Referring to FIG. 24, a method (or process) 700 is shown. The method 700 may update a personalized audio track in real time. The method 700 generally comprises a step (or state) 702, a step (or state) 704, a decision step (or state) 706, a step (or state) 708, a step (or state) 710, a decision step (or state) 712, a step (or state) 714, and a step (or state) 716.

The step 702 may start the method 700. In the step 704, the headphones 120*a* may playback the personalized audio track PERAUD_A. Next, the method 700 may move to the decision step 706.

In the decision step 706, the processor 114 may determine whether the attendee 200*a* has selected a different audio track. For example, the smartphone 122*a* may provide the input SEL_A to the audio broadcast device 102 to select from the audio tracks 112*a*-112*n*. If the user has selected a different audio track, then the method 700 may move to the step 708. In the step 708, the decoder 154*a* may receive the newly selected audio track (e.g., an updated version of the signal SAUD_A). Next, in the step 710, the decoder 154*a* may apply the user settings from the signal PREF_A to the selected audio track SAUD_A. Next, the method 700 may move to the decision step 712. In the decision step 706, if the user has not selected a different audio track, the method 700 may move to the decision step 712.

In the decision step 712, the decoder 154*a* may determine whether the attendee 200*a* has changed the user settings. For example, the smartphone 122*a* may provide the input PREF_A to update the user settings. If the user has not changed the user settings, then the method 700 may move to the step 716. If the user has changed the user settings, then the method 700 may move to the step 714. In the step 714, the decoder 154*a* may generate the personalized audio in response to the selected audio track and the updated user settings. Next, in the step 716, the noise cancellation module 152*a* may cancel the ambient audio from the personalized audio. Next, the method 700 may return to the step 704 (e.g., generate the personalized audio PERAUD_A).

Figure 25:
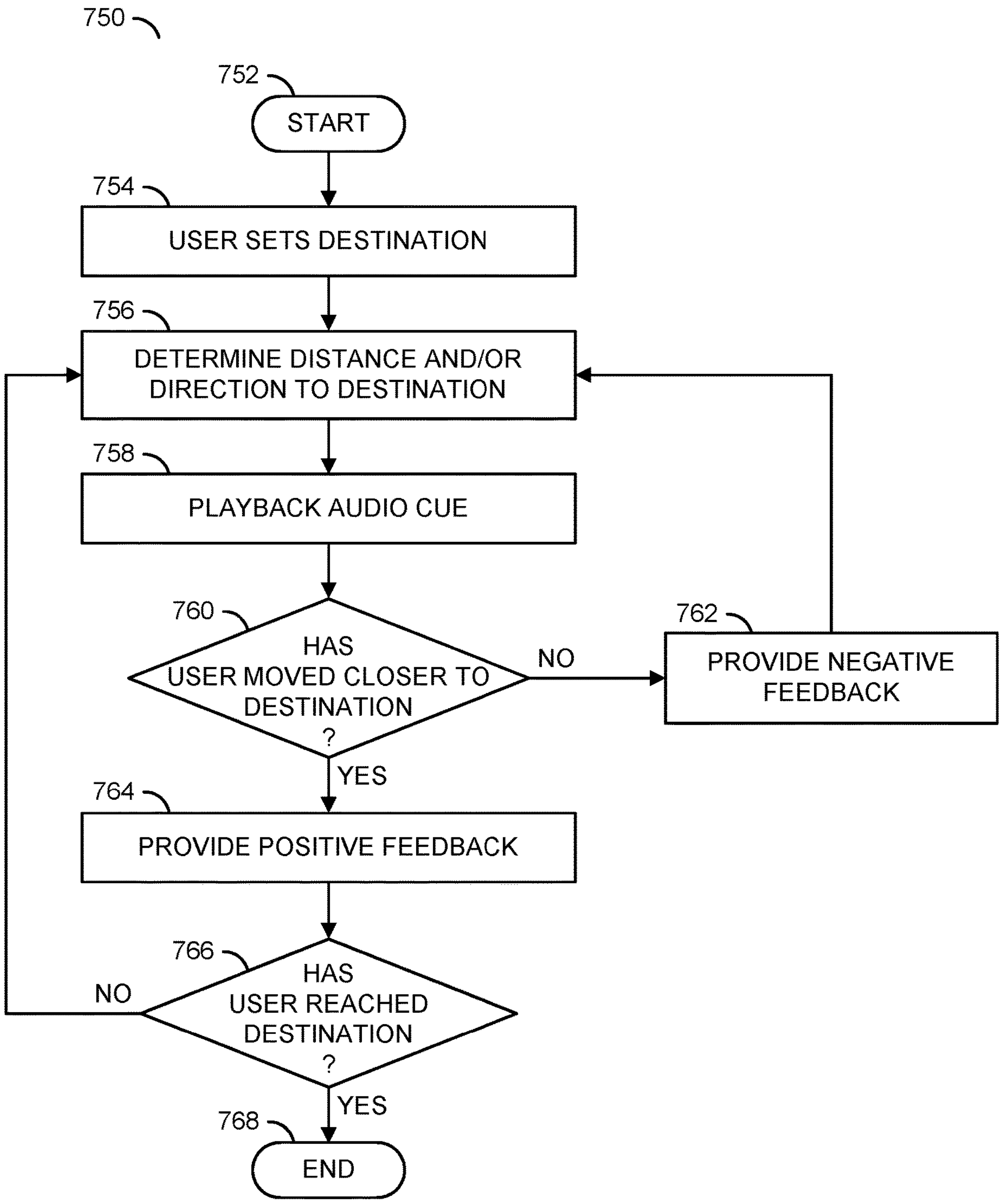
FIG. 25 is a flow diagram illustrating providing audio cues to guide an attendee to a location.

Referring to FIG. 25, a method (or process) 750 is shown. The method 750 may provide audio cues to guide an attendee to a location. The method 750 generally comprises a step (or state) 752, a step (or state) 754, a step (or state) 756, a step (or state) 758, a decision step (or state) 760, a step (or state) 762, a step (or state) 764, a decision step (or state) 766, and a step (or state) 768.

The step 752 may start the method 750. In the step 754, the attendee (e.g., the attendee 200*a*) may use the companion app 260 to set a destination. In one example, the destination may be a bathroom or a concession stand for the venue 50. In another example, the destination may be the location of the seat indicator 372. Next, in the step 756, the processor 138*a* may determine a distance and/or direction of the attendee 200*a* to the destination. For example, the motion sensing module 156 may be configured to determine a direction and/or orientation of the headphones 120*a* to use as a proxy for the location of the attendee 200*a*. In the step 758, the processor 162 may generate an audio cue. The audio cue may utilize the stereo and/or 3D audio capabilities of the speakers 150 to provide directional audio to indicate where the attendee 200*a* should walk to reach the destination. In an example, the audio cue may be an audio tone that repeats periodically at a frequency based on the distance from the destination (e.g., rapid frequency is close, while slow frequency is farther away). Next, the method 750 may move to the decision step 760.

In the decision step 760, the smartphone 122 may determine whether the attendee 200*a* has moved closer to the destination (e.g., based on the distance and/or direction that the attendee 200*a* has traveled). If the attendee 200*a* has moved farther from the destination, the method 750 may move to the step 762. In the step 762, the processor 162 may generate negative feedback for the attendee 200*a*. For example, the negative feedback may be a decreased pace of the audio cue. Next, the method 750 may return to the step 756. In the decision step 760, if the attendee 200*a* has moved closer to the destination, then the method 750 may move to the step 764. In the step 764, the processor 162 may generate positive feedback for the attendee 200*a*. For example, the positive feedback may be an increased pace of the audio cue. Next, the method 750 may move to the decision step 766.

In the decision step 766, the smartphone 122 may determine whether the attendee 200*a* has reached the destination. If the attendee has not reached the destination, the method 750 may return to the step 756. If the attendee has reached the destination, then the method 750 may move to the step 768. The step 768 may end the method 750.

In some embodiments, the attendees 200*a*-200*n* may be encouraged to wear the headphones 120*a*-120*n* at all times as they enter the venue 50 and have a connection to the smartphone 122 for the companion app 260. In an example, using the destination and audio cue described by the method 750 may enable the attendees 200*a*-200*n* to find the in exit the dark environment of a movie theater. For example, the audio cue may indicate how close the attendee 200*a*-200*n* is to the destination. The destination may be the location of a friend and/or some social network connection provided by the remote device 134 (e.g., the audio cue may help the attendees 200*a*-200*n* sit next to a friend). Similarly, the destination and audio cue navigation may help the attendees 200*a*-200*n* locate exits in case of an emergency. For example, the processor 114 may determine which exit each of the attendees 200*a*-200*n* should use and automatically set the destination to prevent a traffic jam at the exits.

The processor 162 may generate the audio cue in response to the head movements of the attendees 200*a*-200*n*. The magnetometer of the motion sensing module 156 may determine the head movement and the processor 162 may generate the tone to indicate the path to the destination. In one example, the tone may be amplified as the attendee 200*a* approaches the destination. In some embodiments, the audio cue may be an instructional audio playback (e.g., turn left now, and walk forward 10 steps, etc.).

Figure 26:
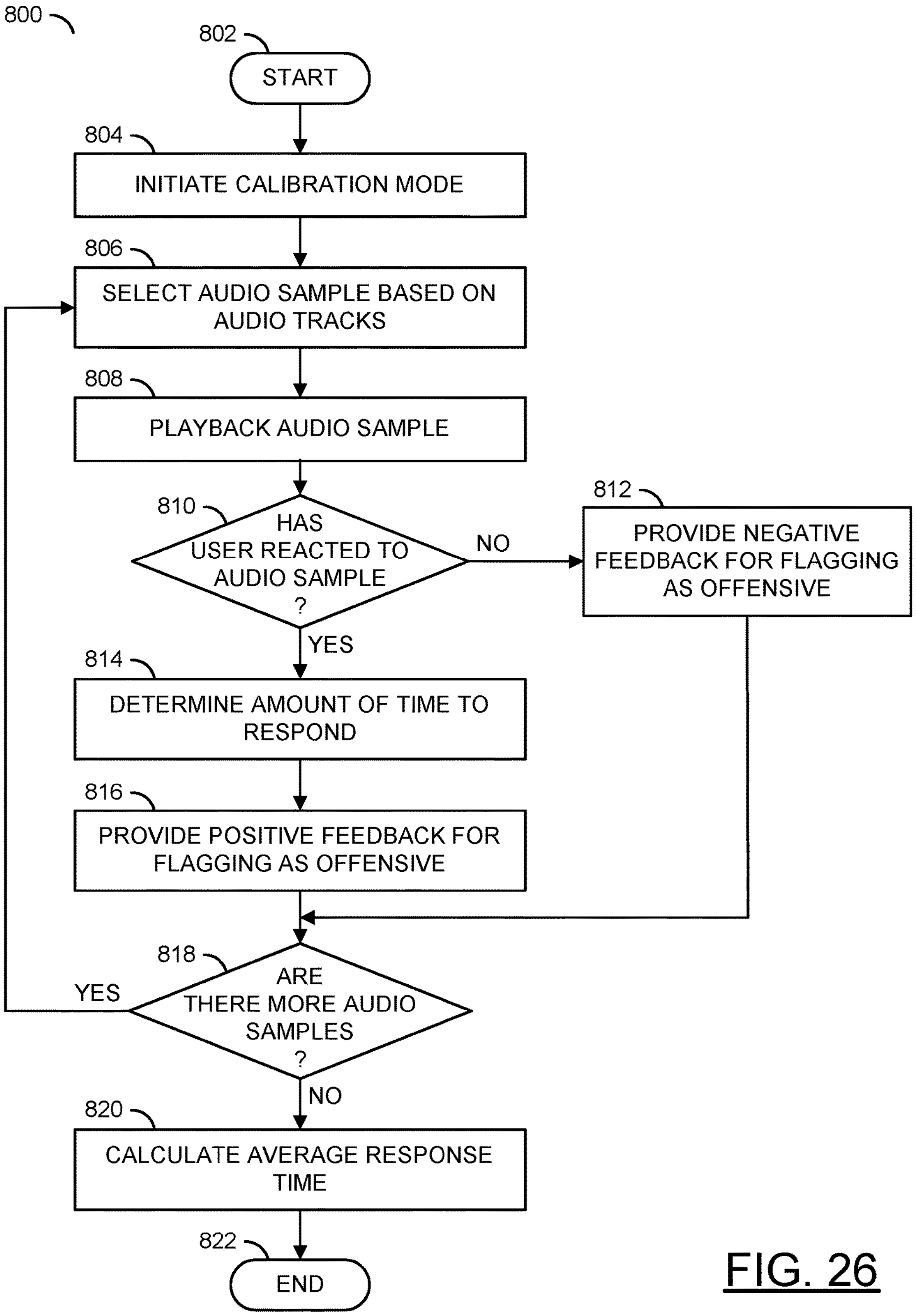
FIG. 26 is a flow diagram illustrating performing a calibration to determine reaction times.

Referring to FIG. 26, a method (or process) 800 is shown. The method 800 may perform a calibration to determine reaction times. The method 800 generally comprises a step (or state) 802, a step (or state) 804, a step (or state) 806, a step (or state) 808, a decision step (or state) 810, a step (or state) 812, a step (or state) 814, a step (or state) 816, a decision step (or state) 818, a step (or state) 820, and a step (or state) 822.

The step 802 may start the method 800. In the step 804, the processor 114 may initiate the calibration mode for determining the reaction time of the attendees 200*a*-200*n* in response to different types of audio. Next, in the step 806, the processor 114 may select an audio sample based on the audio tracks 112*a*-112*n*. In an example, the audio sample may be a potentially distressing sound (e.g., gunfire) that is in the audio tracks 112*a*-112*n*. In another example, the audio samples may be generic sounds that the attendee may enjoy (e.g., a funny sound, a kitten meowing, etc.). Next, in the step 808, the I/O interface 116 may present the audio sample to the headphones 120*a*-120*n*. Next, the method 800 may move to the decision step 810.

In the decision step 810, the processor 114 may determine whether the attendees 200*a*-200*n* have reacted to the audio sample. For example, the attendees 200*a*-200*n* may provide input to the interface 130 in response to the sound. Each of the attendees 200*a*-200*n* may have different reaction times and/or reaction times may vary based on time-of-day, level of intoxication, weariness, etc. For example, an individual reaction time may be determined for each of the attendees 200*a*-200*n*. If the particular attendee (e.g., 200*a*) has not reacted to the sample, then the method 800 may move to the step 812. In the step 812, the processor 114 may generate negative feedback for flagging the sound as offensive (e.g., the attendee 200*a* may not find the sound of gunfire distressing). The broadcast device 102 may further upload the result to the user profile stored by the remote device 134. Next, the method 800 may move to the decision step 818.

In the decision step 810, if the user has reacted to the audio sample, then the method 800 may move to the step 814. In the step 814, the processor 114 may determine an amount of time that the user took to respond. For example, the attendee 200*b* may find the sound distressing and have a reaction time of 2 seconds, while the attendee 200*c* may have a reaction time of 1 second. Next, in the step 816, the processor 114 may generate positive feedback for flagging the sound as offensive. The broadcast device 102 may further upload the result (e.g., that positive feedback and the reaction time) to the user profile stored by the remote device 134. Next, the method 800 may move to the decision step 818.

In the decision step 818, the processor 114 may determine whether there are more audio samples. For example, a violent movie may have a lot of potentially distressing audio samples and a movie for children may have only a few. If there are more audio samples, then the method 800 may return to the step 806. If there are not more audio samples, then the method 800 may move to the step 820. In the step 820, the processor 114 may calculate the average response time for each individual attendee 200*a*-200*n*. The response time may be used for determining how far backwards to search in the personalized audio to find a distressing sound when the user attempts to flag the audio. Next, the method 800 may move to the step 822. The step 822 may end the method 800.

In some embodiments, the venue 50 may provide a short (e.g., 1 or 2 minute) sequence to perform the calibration (e.g., before the trailers are shown when the venue 50 often plays short video clips or advertisements). The calibration sequence method 800 may be a gamified method of determining the reaction time of the attendees 200*a*-200*n* to sounds. In an example, the calibration sequence may provide an advertisement for the system 100 (e.g., users not using the headphones 120*a*-120*n* may have a fear of missing out on the features provided by the system 100 when they see others using the system 100). For example, as more of the attendees 200*a*-200*n* use the headsets 120*a*-120*n* there may be a likelihood that the ambient noise at the venue 50 may increase (e.g., the attendees 200*a*-200*n* may be less aware of the noise they are creating because the noise cancellation muffles the sound), which may entice more of the attendees 200*a*-200*n* to use the headphones 120*a*-120*n*.

The functions performed by the diagrams of FIGS. 1-26 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. A system comprising:

an audio broadcast device configured to generate a plurality of audio tracks;

headphones configured to (i) perform noise cancellation of ambient audio, (ii) decode one of said plurality of audio tracks selected by a user and (iii) playback a personalized audio track in response to (a) said selected audio track and (b) user settings; and an interface device configured to (i) receive said user settings and (ii) enable said user to select one of said audio tracks, wherein said headphones receive said selected audio track from said audio broadcast device in response to said selection using said interface, said user settings are applied to said selected audio track to generate said personalized audio track, and said headphones comprise (i) an audio input device configured to receive speech audio from said user, (ii) a gyroscope configured to measure an orientation of said headphones, (iii) a wireless communication module configured to (a) receive said user settings, said selected audio track and said speech audio from a second user and (b) transmit said speech audio from said user.

2. The system according to claim 1, wherein (i) said plurality of audio tracks are synchronized to a video and (ii) said plurality of audio tracks each comprise a different language track for said video.

3. The system according to claim 1, wherein (i) said system is implemented in a movie theater and (ii) said headphones are used as an alternative audio output option to a sound system of said movie theater.

4. The system according to claim 1, wherein said ambient audio comprises audio generated by members of an audience.

5. The system according to claim 1, wherein (i) said interface device is a smartphone and (ii) said user settings and said selection of one of said audio tracks are received by using a companion application.

6. The system according to claim 5, wherein said companion application is further configured to enable said user to (a) order tickets to an event and (b) buy concessions.

7. The system according to claim 1, wherein said interface device is implemented on each seat of a venue.

8. The system according to claim 1, wherein said interface device is implemented as part of said headphones.

9. The system according to claim 1, wherein said personalized audio track is customized for one of a plurality of attendees.

10. The system according to claim 9, wherein said personalized audio track is (i) unique if said plurality of attendees do not select said selected audio track with said user settings that are the same and (ii) not unique if one of said plurality of attendees selects said selected audio track with said user settings that are the same.

11. The system according to claim 1, wherein said user settings comprise at least one of a volume level, volume levels for particular audio frequencies, audio levels, a profanity filter and sound filters.

12. The system according to claim 1, wherein said user settings comprise options for dubbing over profanity of said selected audio track.

13. The system according to claim 1, wherein said user settings comprise options for adjusting audio levels for each instrument for a live musical event.

14. The system according to claim 1, wherein said headphones are configured to connect wirelessly to said audio broadcast device.

15. The system according to claim 1, wherein (i) said system is implemented at an entertainment venue, (ii) said entertainment venue comprises a plurality of seats and (iii) each of said seats comprises a connection to said audio broadcast device for said headphones.

16. The system according to claim 1, wherein said audio input device and said wireless communication module are configured to enable said user to speak to said second user via said headphones based on said orientation of said headphones.

17. The system according to claim 16, wherein said speech audio from said second user is (a) said ambient audio cancelled by said noise cancellation if said orientation of said headphones worn by said second user does not correspond to facing a direction of said user and (b) played back by said headphones of said user if said orientation of said headphones worn by said second user corresponds to facing said direction of said user.

18. A system comprising:

an audio broadcast device configured to generate a plurality of audio tracks;

headphones configured to (i) perform noise cancellation of ambient audio, (ii) decode one of said plurality of audio tracks selected by a user and (iii) playback a personalized audio track in response to (a) said selected audio track and (b) user settings; and an interface device configured to (i) receive said user settings and (ii) enable said user to select one of said audio tracks, wherein said headphones receive said selected audio track from said audio broadcast device in response to said selection using said interface, said user settings are applied to said selected audio track to generate said personalized audio track, and said interface device comprises a smartphone configured to execute computer readable instructions for running a companion application and (ii) said companion application is configured to (a) receive information about said selected audio track of each of a plurality of attendees of a venue and (b) generate a seating chart graphic comprising information about said selected audio track of each of said plurality of attendees.

19. The system according to claim 18, wherein said information indicates (a) a language of said selected audio track for each of said plurality of attendees and (b) a seat location that corresponds to said language of said selected audio track.

20. The system according to claim 18, wherein (i) said plurality of audio tracks are synchronized to a video and (ii) said plurality of audio tracks each comprise a different language track for said video.

* * * * *